US 8,466,422 B2

(12) United States Patent
Johnson et al.

(10) Patent No.: US 8,466,422 B2
(45) Date of Patent: Jun. 18, 2013

(54) VISIBLE LIGHT AND IR COMBINED IMAGE CAMERA

(75) Inventors: Kirk R. Johnson, Rogers, MN (US); Thomas McManus, Plymouth, MN (US); John W. Pratten, Minnetonka, MN (US)

(73) Assignee: Fluke Corporation, Everett, WA (US)

( * ) Notice: Subject to any disclaimer, the term of this patent is extended or adjusted under 35 U.S.C. 154(b) by 973 days.

(21) Appl. No.: 12/543,252

(22) Filed: Aug. 18, 2009

(65) Prior Publication Data

US 2009/0302219 A1 Dec. 10, 2009

Related U.S. Application Data

(63) Continuation of application No. 11/458,600, filed on Jul. 19, 2006, now Pat. No. 7,994,480, which is a continuation of application No. 11/294,752, filed on Dec. 5, 2005, now Pat. No. 7,538,326.

(60) Provisional application No. 60/633,078, filed on Dec. 3, 2004.

(51) Int. Cl.
*G01T 1/24* (2006.01)
*H01L 25/00* (2006.01)
*A61B 6/00* (2006.01)

(52) U.S. Cl.
USPC ............... 250/370.08; 250/332; 600/476

(58) Field of Classification Search
USPC .......... 250/370.08, 330, 332, 311, 358.1, 250/359.1, 339.11, 339.12; 600/476
See application file for complete search history.

(56) References Cited

U.S. PATENT DOCUMENTS

| 4,448,528 | A | 5/1984 | McManus |
| 4,608,599 | A | 8/1986 | Kaneko et al. |
| 4,679,068 | A | 7/1987 | Lillquist et al. |
| 4,751,571 | A | 6/1988 | Lillquist |
| 4,967,276 | A | 10/1990 | Murakami et al. |
| 5,005,083 | A | 4/1991 | Grage et al. |
| 5,140,416 | A | 8/1992 | Tinkler |
| 5,173,726 | A | 12/1992 | Burnham et al. |
| 5,381,205 | A | 1/1995 | Kotani et al. |
| 5,488,674 | A | 1/1996 | Burt et al. |
| 5,534,696 | A | 7/1996 | Johansson et al. |
| H1599 | H | 10/1996 | Task et al. |
| 5,781,336 | A | 7/1998 | Coon et al. |
| 5,808,350 | A | 9/1998 | Jack et al. |
| 5,832,325 | A | 11/1998 | Ito et al. |
| 5,910,816 | A | 6/1999 | Fontenot et al. |

(Continued)

FOREIGN PATENT DOCUMENTS

| EP | 0343634 A2 | 11/1989 |
| EP | 1339228 A1 | 8/2003 |

(Continued)

OTHER PUBLICATIONS

Brochure, Insight 80 Series, Loki Data Products, Inc., Greensboro, NC.

(Continued)

*Primary Examiner* — David Porta
*Assistant Examiner* — Faye Boosalis
(74) *Attorney, Agent, or Firm* — Fredrikson & Byron, PA

(57) ABSTRACT

Methods, camera, and a computer-readable medium for registering on a camera display infrared and visible light images of a target scene taken from different points of view causing a parallax error.

43 Claims, 19 Drawing Sheets

U.S. PATENT DOCUMENTS

| | | | |
|---|---|---|---|
| 5,944,653 | A | 8/1999 | Bonnell et al. |
| 5,974,272 | A | 10/1999 | Kiesow et al. |
| 6,009,340 | A | 12/1999 | Hsia |
| 6,020,994 | A | 2/2000 | Cook |
| 6,031,233 | A | 2/2000 | Levin et al. |
| 6,208,459 | B1 | 3/2001 | Coon et al. |
| 6,222,187 | B1 | 4/2001 | Shivanandan |
| 6,232,602 | B1 | 5/2001 | Kerr |
| 6,335,526 | B1 | 1/2002 | Horn |
| 6,370,260 | B1 | 4/2002 | Pavlidis et al. |
| 6,373,055 | B1 | 4/2002 | Kerr |
| 6,417,797 | B1 | 7/2002 | Cousins et al. |
| 6,444,983 | B1 | 9/2002 | McManus et al. |
| 6,449,005 | B1 | 9/2002 | Faris |
| 6,560,029 | B1 | 5/2003 | Dobbie |
| 6,570,156 | B1 | 5/2003 | Tsuneta et al. |
| 6,762,884 | B2 | 7/2004 | Beystrum et al. |
| 6,781,127 | B1 | 8/2004 | Wolff et al. |
| 6,798,578 | B1 | 9/2004 | Beystrum et al. |
| 6,806,469 | B2 | 10/2004 | Kerr |
| 6,849,849 | B1 | 2/2005 | Warner et al. |
| 7,034,300 | B2 | 4/2006 | Hamrelius et al. |
| 7,274,830 | B2 | 9/2007 | Bacarella et al. |
| 2002/0030163 | A1 | 3/2002 | Zhang |
| 2003/0133132 | A1 | 7/2003 | Kiermeier et al. |
| 2004/0001184 | A1 | 1/2004 | Gibbons et al. |
| 2004/0071367 | A1 | 4/2004 | Irani et al. |
| 2004/0169617 | A1 | 9/2004 | Yelton et al. |
| 2004/0225222 | A1 | 11/2004 | Zeng et al. |
| 2004/0264542 | A1 | 12/2004 | Kienitz |
| 2006/0208169 | A1 | 9/2006 | Breed et al. |
| 2007/0235634 | A1 | 10/2007 | Ottney et al. |

FOREIGN PATENT DOCUMENTS

| | | | |
|---|---|---|---|
| GB | 2389989 | A1 | 12/2003 |
| JP | 10293368 | | 11/1998 |
| JP | 11112851 | | 4/1999 |
| JP | 11285025 | | 10/1999 |
| JP | 2002281491 | | 9/2002 |
| JP | 2004072189 | | 3/2004 |
| JP | 2005173879 | | 6/2005 |
| WO | 0196824 | A1 | 12/2001 |

OTHER PUBLICATIONS

Press Release, Agema Presents Superviewer II, Oct. 10, 1986.
ThermoVision(R) Superviewer II, Operating Instructions, Oct. 1990.
Brochure, Video Therm 96, Portable Infrared Imaging System with Integrated Visible Camera, Jun. 1993.
Brochure, VideoTherm 300 Series, ISI Group, Inc., Albuquerque, NM, 1994.
Manual, VideoTherm 300 Series, ISI Group, Inc., Albuquerque, NM, Jun. 1993.
Manual, Agema 480, Agema Infrared Systems, AB, 1992.
Brochure, Inframetrics, ThermaGRAM, Thermal Image Processing System, Inframetrics, Billerica, MA, Nov. 1991.
U.S. Appl. No. 11/294,752, filed Dec. 5, 2005, Notice of Allowance, 9 pages.
U.S. Appl. No. 11/294,752, Office Action dated Oct. 18, 2006, 11 pages.
U.S. Appl. No. 11/294,752, Office Action dated Apr. 18, 2007, 8 pages.
U.S. Appl. No. 11/294,752, Office Action dated Jan. 9, 2008, 6 pages.
U.S. Appl. No. 11/294,752, Notice of Allowance dated Sep. 12, 2008, 7 pages.
U.S. Appl. No. 11/625,140, Office Action dated Jan. 3, 2008, 7 pages.
U.S. Appl. No. 11/625,140, Notice of Allowance dated Jan. 3, 2008, 6 pages.
U.S. Appl. No. 11/625,140, filed Jan. 19, 2009, Notice of Allowance, 6 pages.
PCT/US2005/043825, International Search Report and Written Opinion, dated Dec. 15, 2006, 11 pages.
PCT/US2005/043825, International Preliminary Examination Report and Written Opinion, dated Dec. 15, 2006, 8 pages.
EP Application No. 072501968, European Search Report and Opinion dated Mar. 26, 2007, 4 pages.
Brochure, Insight STARsight Thermal Imaging System, Insight Vision Systems, Kensington, MD, Aug. 23, 1991.
Brochure, Avio, TVS-5000 Series, Nippon Avionics Co. Ltd., Minato-ku, Tokyo, Japan, Mar. 1989.
Brochure, Hughes Probeye 4000-3000, Hughes Aircraft Company, Carlsbad, California, Feb. 1993.
Brochure, Inframetrics, Model 600L IR Imaging Radiometer, Inframetrics The Infrared Specialists, Bedford, MA, Brochure No. 600L-S04622-5M-0488-AKI/CP. Apr. 1988.

VISIBLE LIGHT AND IR COMBINED IMAGE CAMERA

RELATED APPLICATIONS

The present application is a continuation of co-pending U.S. patent application Ser. No. 11/458,600, filed Jul. 19, 2006, which is a continuation of U.S. patent application Ser. No. 11/294,752, filed Dec. 5, 2005, now issued as U.S. Pat. No. 7,538,326, which in turn claims priority to U.S. Provisional Patent Application No. 60/633,078, filed Dec. 3, 2004, the disclosures of which are herein incorporated by reference in their entirety.

BACKGROUND

Many infrared cameras today produce an image (IR image) of a scene using only energy in the far-infrared portion of the electromagnetic spectrum, typically in the 8-14 micron range. Images obtained using these cameras assign colors or gray-levels to the pixels composing the scene based on the intensity of the IR radiation reaching the camera's sensor elements. Because the resulting IR image is based on the target's temperature, and because the colors or levels displayed by the camera do not typically correspond to the visible light colors of the scene, it can be difficult, especially for novice users of such a device, to accurately relate features of interest (e.g. hot spots) in the IR scene with their corresponding locations in the visible-light scene viewed by the operator. In applications where the infrared scene contrast is low, infrared-only images may be especially difficult to interpret.

An infrared scene is a result of thermal emission and, not all, but most infrared scenes are by their very nature less sharp compared to visible images which are a result of reflected visible light. For example, considering an electric control panel of an industrial machine which has many electrical components and interconnections, the visible image will be sharp and clear due to the different colors and well defined shapes. The infrared image may appear less sharp due to the transfer of heat from the hot part or parts to adjacent parts.

When panning an area with an infrared camera looking for hot or cold spots, one can watch the camera display for a visible color change. However, sometimes the hot or cold spot may be small and the color change may go unnoticed. To aid in the identification of hot or cold spots, infrared cameras often indicate the hot spot or cold spot location via a visible cursor or other graphical indicator on the display. The temperature of such hot spots, calculated using well-known radiometric techniques (e.g., establishing or measuring a reference temperature), is often displayed nearby the cursor. Even with the color change and the hot spot indications, it can be difficult to accurately relate the hot spot (or other features of interest) in the camera display's IR imagery with their corresponding locations in the visible-light scene viewed by the operator.

To address this problem of better identifying temperature spots of interest, some cameras allow the operator to capture a visible-light image (often called a "control image") of the scene using a separate visible light camera built into the infrared camera. The FLIR ThermaCam® P65 commercially available from FLIR Systems of Wilsonville, Oreg. is an example of such a camera. These cameras provide no capability to automatically align, or to merge the visible-light and infrared images in the camera. It is left to the operator to manually correlate image features of interest in the infrared image with corresponding image features in the visible-light image.

Alternatively, some infrared cameras employ a laser pointer that is either built into, or affixed to the camera. The FLIR ThermaCam® E65 commercially available from FLIR Systems of Wilsonville, Oreg. is an example of such a camera. This laser pointer projects a visible point or area onto the target, to allow the user to visually identify that portion of the target scene that is being displayed by the infrared camera. Because the laser pointer radiation is in the visible spectrum, it is not visible in the infrared image. As a result, the laser pointer is of limited value in infrared cameras. This can be problematic when the location of a hot or cold spot is difficult to identify. For example, large industrial control panels often have many components that are similar in shape and packed tightly together. It is sometimes difficult to determine the exact component that is causing a thermal event, such as a hot spot in the infrared camera image.

Other infrared temperature measurement instruments may employ either a single temperature measurement sensor, or a very small number of temperature sensors arrayed in a grid pattern. Single point instruments typically provide a laser pointing system to identify the target area by illuminating the point or area viewed by the single temperature sensor element, e.g. Mikron M120 commercially available from Mikron Infrared Inc. of Oakland, N.J. Alternatively, some systems employ an optical system that allows the user to visually identify the point in the target scene that is being measured by the instrument by sighting through an optical path that is aligned with the temperature sensor, e.g. Mikron M90 commercially available from Mikron Infrared Inc. of Oakland, N.J. Instruments with more than one sensor element typically provide a very crude infrared image made up of a small number of scene pixels, each with a relatively large instantaneous field of view (IFOV), e.g. IRISYS IRI 1011 commercially available from Advanced Test Equipment of San Diego, Calif. It can be very difficult to accurately identify features of interest using such images.

SUMMARY

Certain embodiments of the invention relate to a method of displaying visible-light (VL) images and infrared (IR) images. The method includes providing a camera having a VL lens with a VL sensor, an IR lens with an IR sensor, and display. The optical axes of the VL and IR lenses are offset from and generally parallel to each other so that the VL and IR sensors sense VL and IR images, respectively, of a target scene from different points of view causing a parallax error. The method includes focusing the IR lens on the target with the focusing operating to bring the VL image into register with the IR image to correct the parallax error. The method also includes displaying at least a portion of the VL image in register with at least a portion of the IR image on the display.

Certain embodiments of the invention relate to a method of displaying visible-light (VL) images and infrared (IR) images. The method includes providing a camera having a VL lens with a VL sensor, an IR lens with an IR sensor, and display. The optical axes of the VL and IR lenses are offset from and generally parallel to each other so that the VL and IR sensors sense VL and IR images, respectively, of a target scene from different points of view causing a parallax error. The method includes displaying at least a portion of the VL image with at least a portion of the IR image on the display where the IR image is displayed with the corresponding portion of the VL image. The method also includes registering the VL and IR images on the display by displacing them relative to each other until registered to correct the parallax error via a manual adjustment mechanism.

Certain embodiments of the invention relate to a camera that produces visible light (VL) and infrared (IR) images. The camera includes a VL lens, a VL sensor, an IR lens, an IR sensor, and a display. The VL sensor is associated with the VL lens and has an array of VL sensor elements that produce a VL image of a target scene. The IR sensor is associated with the IR lens and has an array of IR sensor elements that produce an IR image of the target scene. The IR image is produced by substantially fewer sensor elements than are used to produce the VL image. The optical axes of the VL and IR lenses are offset from and generally parallel to each other so that the VL and IR sensors sense VL and IR images, respectively, of a target scene from different points of view causing a parallax error. Rotation of the IR lens causes an axial shift of the IR lens relative to the IR to the IR sensor to focus the IR lens. The focusing of the IR lens registers the VL image with the IR image to correct the parallax error. The display concurrently displays at least a portion of the VL image registered with at least a portion of the IR image.

Certain embodiments of the invention relate to a computer-readable medium programmed with instructions for performing a method of registering multiple images where the medium comprising instructions for causing a programmable processor to receive first and second images of a target scene. The first image is produced by a VL lens and a VL sensor with an array of VL sensor elements. The second image has a parallax error with the first image and is produced by an IR lens and an IR sensor with an array of IR sensor elements. The IR sensor has substantially fewer sensor elements than the VL sensor. The medium also includes instructions to determine a value indicative of the distance between the IR lens and a target within the target scene. The medium also includes instructions to correct the parallax error using the determined value to register the first and second images, and display at least portions of the first and second images on a display with the portions of the first and second images in register.

DETAILED DESCRIPTION

System Description

Figure 1:
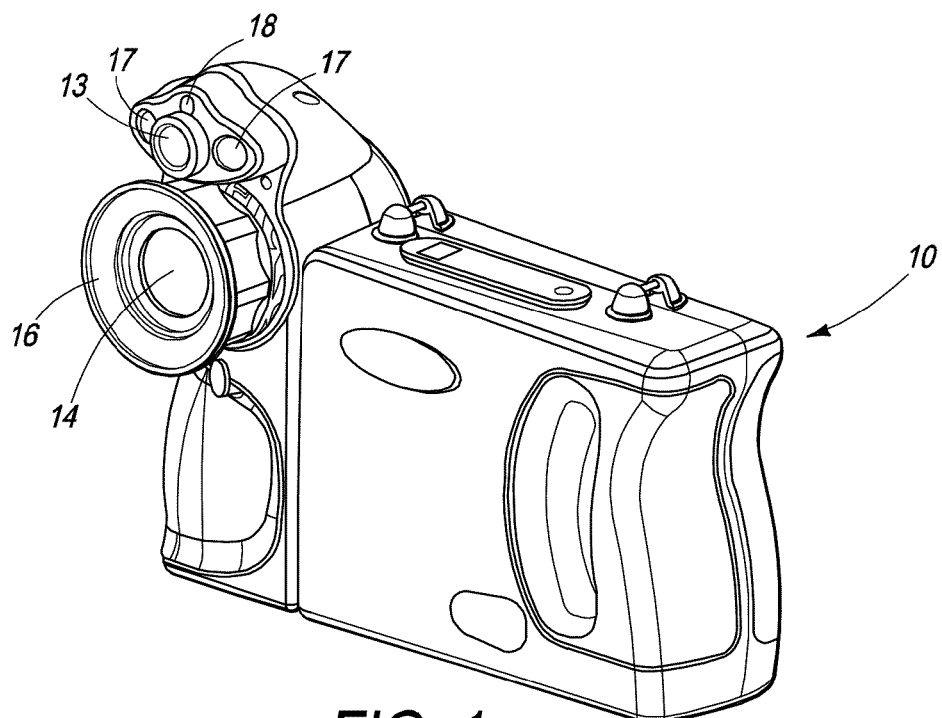
FIGS. 1 and 2 are front and rear perspective views of a camera according to an embodiment of the invention.
Figure 2:
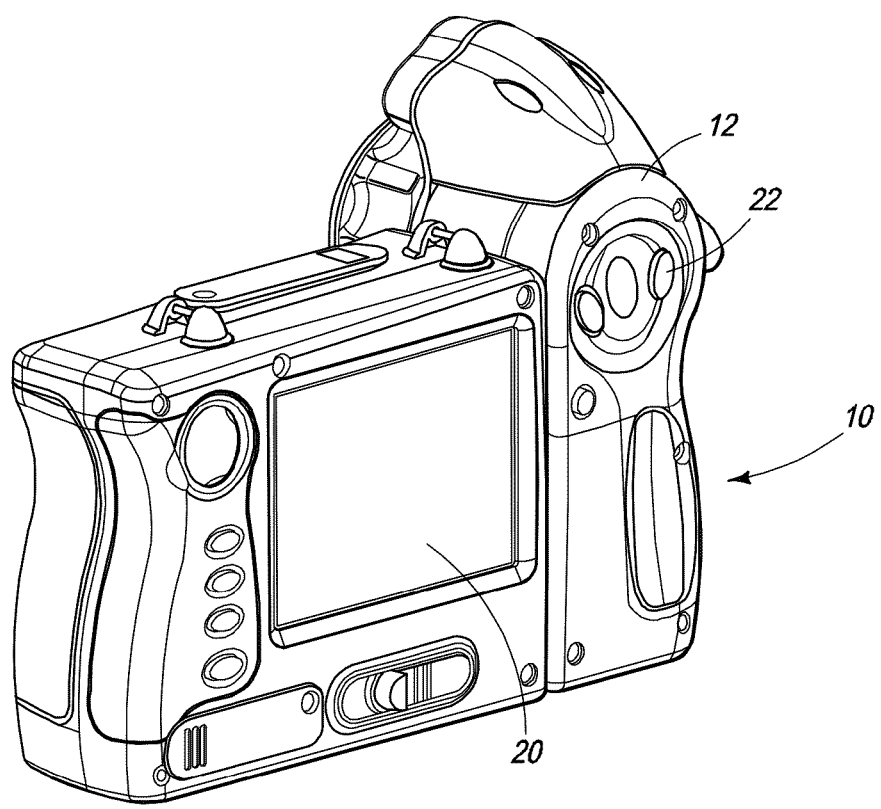

FIGS. 1 and 2 are perspective views of the front and the back of a camera 10 according to an embodiment of the invention. The housing includes an infrared camera module and a visible-light camera module. In particular, the camera 10 includes a camera housing 12, a Visible-Light (VL) lens 13, an infrared lens 14, focus ring 16 and a laser pointer 18 as well as various electronics located within the housing as will be described with reference to FIG. 3. In an embodiment, an LED torch/flash 17 is located on each side of the VL lens 13 to aid in providing enough light in dark environments. A display 20 is located on the back of the camera so that infrared images, visible light images and/or blended images of Infrared and Visible-Light may be viewed. In addition, target site temperature (including temperature measurement spot size) and distance readings may be displayed. Also located on the back of the camera are user controls 22 to control the display mode and activate or deactivate the laser pointer.

Figure 3:
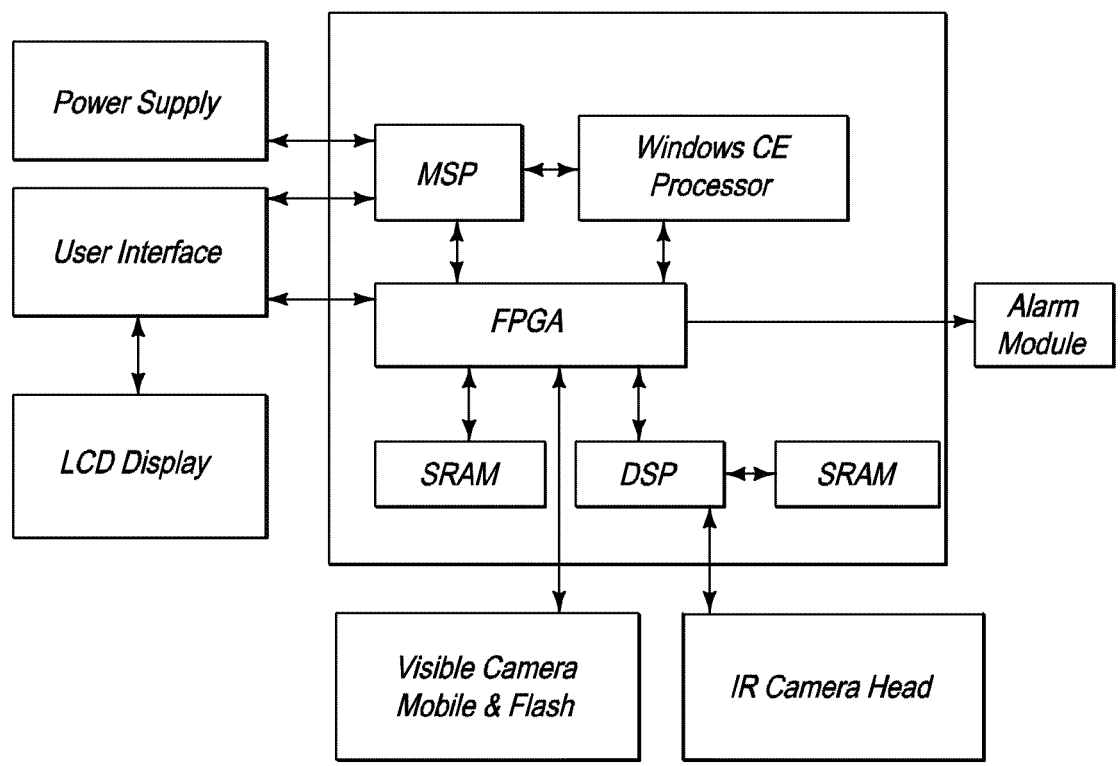
FIG. 3 shows a block diagram of a representative camera system according to an embodiment of the invention that can be used to practice embodiments of the invention.

FIG. 3 shows a block diagram of a representative camera system according to an embodiment of the invention that can be used to practice embodiments of the invention.

The Visible-Light camera module includes a CMOS, CCD or other types of visible-light camera, LED torch/flash and a laser pointer. This camera streams RGB image display data (e.g. 30 Hz) to the FPGA for combination with infrared RGB image data and then sends the combined image data to the display.

The Analog Engine interfaces with and controls the infrared sensor, and streams raw infrared image data (e.g. 30 Hz)

to the DSP. The DSP performs computations to convert the raw infrared image data to scene temperatures, and then to RGB colors corresponding to the scene temperatures and selected color palette. For example, U.S. Pat. No. 6,444,983 entitled "Microbolometer Focal Plane Array With Controlled Bias," assigned to the present assignee, is incorporated herein in its entirety, discloses such an infrared camera. The DSP then streams the resulting infrared RGB image display data to the FPGA where it is combined with the VL RGB image data and then sends the combined image data to the display.

The Embedded Processor Card Engine includes a general-purpose microprocessor that provides a graphical user interface (GUI) to the camera operator. This GUI interface consists of menus, text, and graphical display elements that are sent to the FPGA, where they are buffered in SRAM and then sent to the display.

The MSP430 interfaces with the user interface including camera buttons, mouse, LCD backlight, and the smart battery. It reads these inputs and provides the information to the embedded processor card engine where it is used to control the GUI and provides other system control functions.

The FPGA drives the display(s) (LCD and/or TV, for example) with combined visible-light image data, infrared image data, and GUI data. The FPGA requests both the visible-light and infrared image data from the VL and infrared camera modules and alpha-blends them together. It also alpha-blends the resulting display image with the GUI data to create a final blended image that is sent to the LCD display. Of course the display associated with the embodiments of the invention is not limited to an LCD-type display. The FPGA operates under control of the DSP, which is further controlled by the embedded processor card engine. The degree of image alpha-blending and the display mode, i.e. picture-in-a-picture, full screen, color alarm and zoom mode, is controlled by the user through the GUI. These settings are sent from the embedded processor card engine to the DSP which then configures the FPGA properly.

Optical Configuration

Embodiments of the invention combine an engine of a real-time visible-light camera with an engine of a real-time infrared camera close to each other in the same housing such that the optical axes are roughly parallel to each other.

Figure 4:
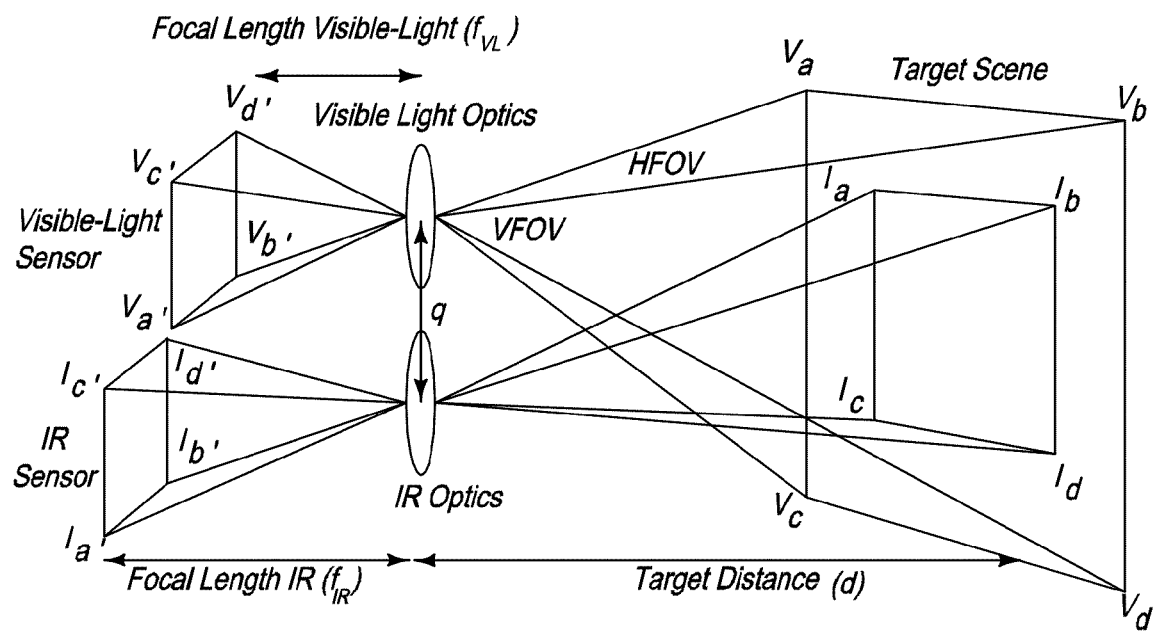
FIG. 4 is a diagram showing the optical path and sensor configuration of the camera.

The camera according to the embodiments of the invention places the engine or module of a real-time visible-light camera in the housing of a real-time infrared camera. The placement is such that the visible and infrared optical axes are as close as practical and roughly parallel to each other, for example, in the vertical plane of the infrared optical axis. Of course other spatial arrangements are possible. The visible light camera module, i.e., VL optics and VL sensor array, are chosen to have a larger field of view (FOV) than the infrared camera module. FIG. 4 is a diagram showing the optical path and sensor configuration of the camera. As shown in the diagram, there are two distinct optical paths and two separate sensors. One for visible-light, and one for infrared. Because the optical paths for the sensors are different, each sensor will "see" the target scene from slightly different vantage points thereby resulting in parallax error. As will be described in detail hereinafter, the parallax error is corrected electronically using software manipulations. This provides the capability to electronically correct the displayed images for parallax. In certain embodiments, the visible-light optics and sensor are chosen so that their respective field of views (FOV) are different, i.e. one is larger than the other. For instance, in one embodiment, the VL FOV is greater than the infrared FOV. This provides cost effectiveness. Presently, for a given number of pixel sensors, visible light sensor arrays are much cheaper than infrared sensor arrays. Accordingly, for a given field of view and resolution (instantaneous field of view), visible light sensor arrays are cheaper than infrared sensor arrays.

In certain embodiments, the visible light optics are such that the visible light camera module remains in focus at all usable distances. Only the infrared lens needs focus adjustment for targets at different distances.

Parallax Correction and Display Modes

Figure 5:
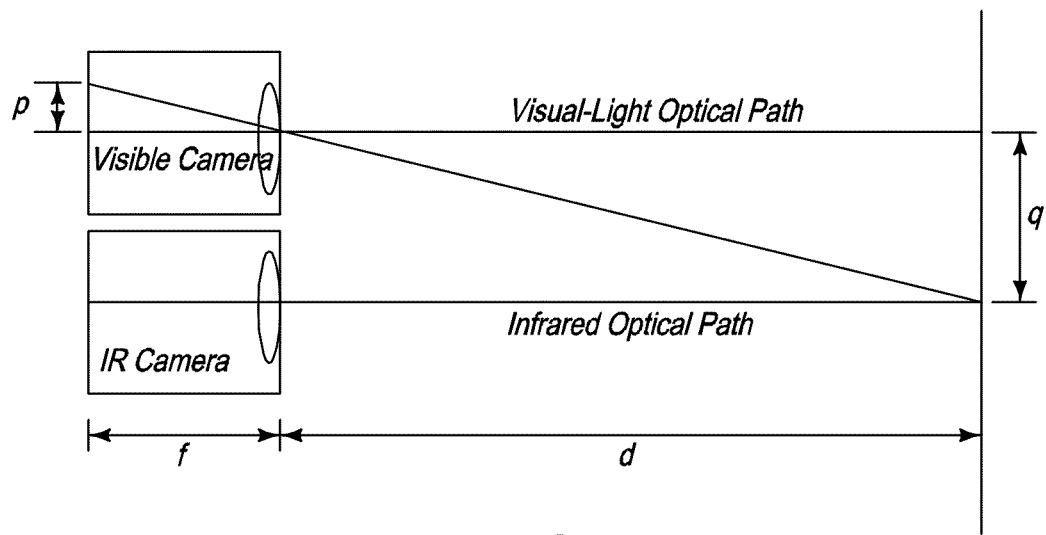
FIG. 5 shows geometrically, the derivation of the parallax equation.

FIG. 5 shows geometrically, the derivation of the parallax equation (eq. 1). As can be seen by the equation, parallax can be reduced by minimizing the distance (q) between the visible-light and infrared optical apertures, and also by choosing short focal length lenses. The camera design will typically physically fix (q). In certain embodiments, the focal lengths of the visible-light and infrared lens (f) can be altered in the field by changing lenses, or using optical systems that include multiple focal lengths or continuous zoom. In the embodiments with fixed focal length lenses, the focal lengths remain constant during operation once the lenses are installed. Hence, during camera operation, parallax is simply a function of distance (d) to the target. In the embodiment shown, the focal length (f) of each lens is the same. In alternate embodiments, the focal lengths (f) of the infrared lens and the visible lens may differ from each other.

The camera corrects the visible-light and infrared images for parallax and provides several different methods to display the registered images to the operator. These methods are described below. In general, parallax error corrections are based on the infrared focus distance as will be described hereinafter. However, parallax error may also be corrected by determining the distance from the target image (other than via focus distance) by schemes known to those of ordinary skill in the art.

The camera according to the embodiments of the invention can operate in one of three display modes; 1) full screen visible, infrared and/or blended, 2) picture-in-a-picture such as partial infrared image in a full screen visible image, and 3) infrared color alarms in visible-light images. In any one of these display modes, temperatures will be recorded and can be displayed in the infrared portion of the image. Temperatures can also be displayed on a visible-light only image from the recorded but not displayed infrared image.

Figure 6:
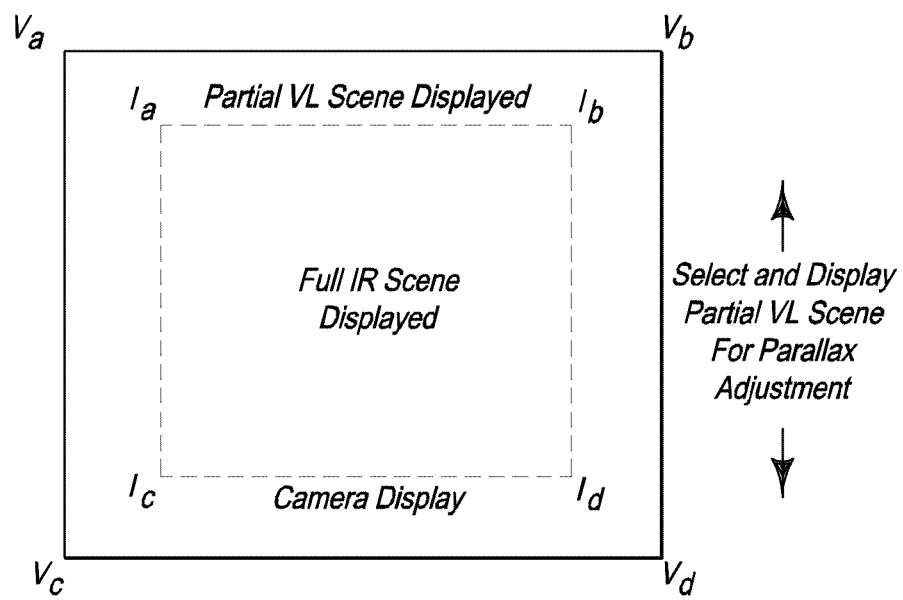
FIG. 6 shows the (Full-Screen, Full-Sensor infrared)/(Full-Screen, Partial-Sensor Visible-Light) scene display mode.

In the full screen display mode, an operator has a choice of selecting for display a full screen visible-light only image, a full screen infrared only image, or a full screen blend of visible-light and infrared images. In an embodiment of the invention, the display is about 320 by 240 pixels and is represented by the dashed-line box shown in FIG. 6. The infrared sensor has 160 by 120 pixels and the visible-light sensor has 1280 by 1024 pixels. These particular dimensions are given by way of example and are not limiting to any of the embodiments of the invention. Thus, the infrared sensor, the VL sensor and display may each be individually larger or smaller than the particular examples given. FIG. 6 shows a diagram of the mode where the full 160 by 120 infrared image is interpolated to fill the camera display. Based on the display mode chosen, a portion of the 1280 by 1024 visible-light image is windowed to match the infrared window. Since the number of selected visible-light sensor elements does not necessarily match the 320 by 240 pixels of the camera display, the visible-light image is scaled to match the camera display. After parallax error correction, each resulting infrared display pixel will represent the same instantaneous field of view (IFOV) as its corresponding visible-light display pixel. Because the two images are matched, the camera operator can easily identify points-of-interest in the infrared image with objects in the visible-light image simply by noting where the features of interest overlie each other in the two images. In the embodiment shown in FIG. 6, the display mode is entitled "Full-Screen, Full-Sensor Infrared and Full-Screen, Partial-Sensor Visible-Light display mode." Additional display modes are discussed further below.

Figure 7:
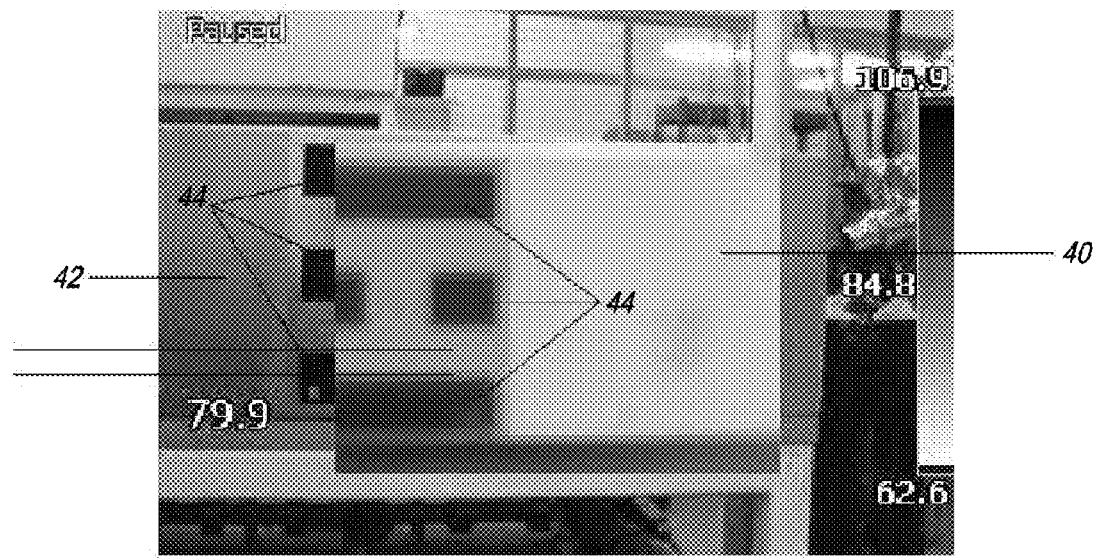
FIGS. 7 and 8 are cross-sectional views of an infrared camera module with a magnet and Hall-Effect sensor according to an embodiment of the invention.
Figure 8:
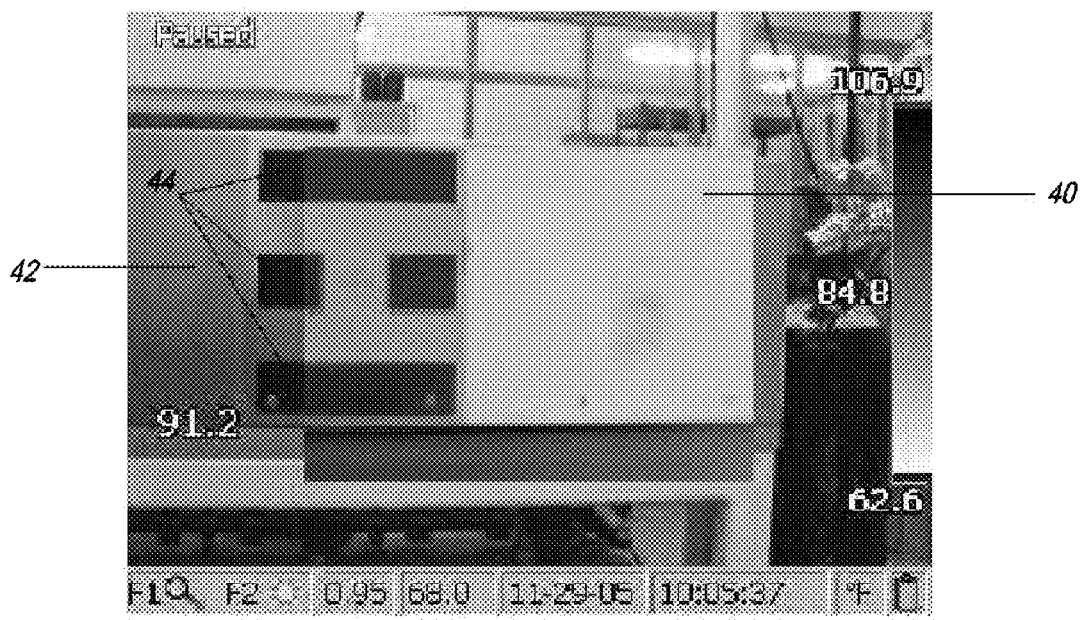

Parallax error between the visible-light image and the infrared image is corrected automatically by the camera. This process is referred to as registering. In order to apply the proper parallax correction, the camera must first determine the distance to the target object of interest. One method to determine the target distance is to sense the focus position of the infrared lens using a Hall-effect sensor. FIGS. 7 and 8 show a sectional view of camera 10 taken from front to rear through the center of infrared lens 14. Referring to FIGS. 7 and 8, a Hall-Effect sensor 30 is fixed in the housing 32 with respect to the infrared sensor array 34 to sense the proximity of a magnet 36 attached to the back of the IR lens 14. As the focus of the lens is changed via rotation of focus ring 16, the distance f' between the magnet 36 and the Hall-Effect sensor 30 changes, resulting in an output from the Hall-Effect sensor that is proportional to focus position. (The focus of the lens could be changed by moving the lens or moving the infrared sensor array.) This focus position is used to derive an estimate of the distance to the target. The infrared lens focus position provides an especially convenient estimate of distance because typical infrared lenses have a low F-number, resulting in a shallow depth of field. The Hall-Effect sensor may, in one embodiment, be fixed on the infrared sensor array. In addition, the positions of the Hall-Effect sensor and magnet may be reversed from that shown.

In the embodiment shown in FIGS. 7 and 8, the magnet 36 is a ring that encircles an interior surface of the focus ring 16 facing the infrared sensor array 34. The Hall-Effect sensor 30 is fixed in the camera housing 32 a small distance from of the infrared sensor array 34. The distance between the Hall-Effect sensor and the magnet represents the distance f' shown in FIGS. 7 and 8. FIG. 7 shows the lens positioned for near focus and FIG. 8 shows the lens positioned for far focus in which case the magnet is closer to the Hall-Effect sensor than in FIG. 7. Mechanisms and methods other than those described above for a Hall effect sensor may, of course, be employed to determine the distance to target. Such equivalent mechanisms or methods would be known to those with skill in the art. The Hall-Effect sensor is one convenient method.

Estimating the distance between the target and the camera is a valuable safety feature. For example, OSHA has specific safety distance requirements when inspecting high voltage electrical cabinets. Thus, using the camera according to the embodiments of the invention, one can display the distance to the target on the display so that the camera operator is assisted in complying with OSHA's safety requirements.

In addition, it can be valuable to know the size of the spot on the target that is being measured (instantaneous field of view spot size). Because the spot size is a function of distance and the embodiments of the invention have the ability to measure (or rather estimate) distance that is needed to correct parallax error, spot size can be calculated as a function of distance and displayed to the camera operator via the display.

Figure 9:
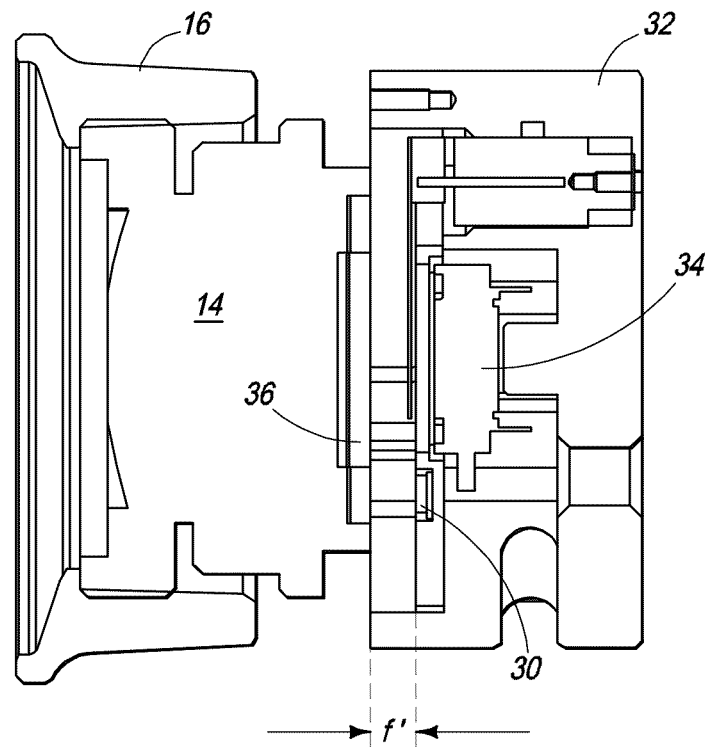
FIG. 9 shows combined visible-light and infrared images uncorrected for parallax error.
Figure 10:
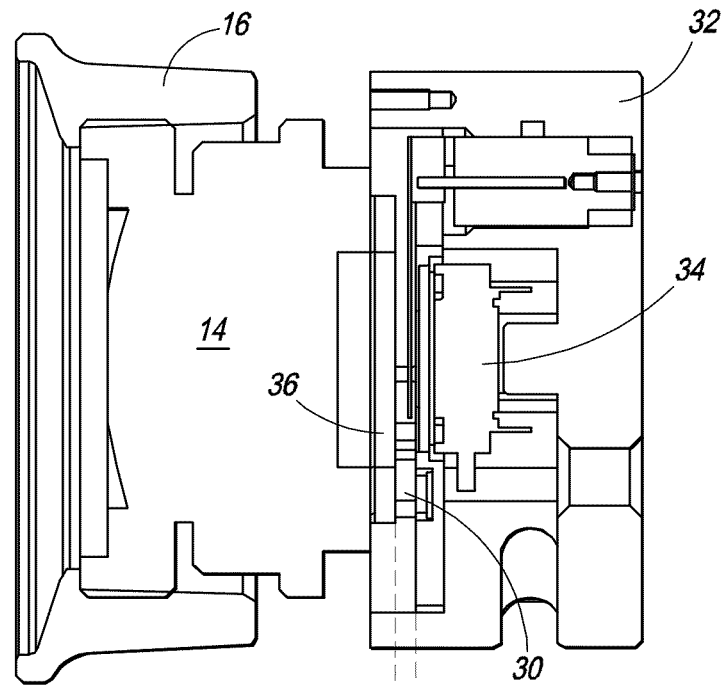
FIG. 10 shows the same images corrected for parallax error.

The lens position sensor value to focus distance correlation for each infrared lens is determined at the factory and stored with other camera calibration data in the camera's non-volatile memory. This calibration data includes X and Y image offsets calculated for each focus distance. By utilizing the sensed infrared lens focus position and the factory calibration data, the correct X and Y sensor offsets of the partial area from the visible-light sensor to be displayed can be computed and used to select the appropriate visible-light sensor area for the current infrared focus distance. That is, as the focus distance of the infrared lens is changed, different areas of the visible-light sensor image are extracted and displayed, resulting in registration of the infrared and visible-light images for objects at the focus distance. FIG. 9 shows combined picture-in-a-picture display of visible-light and infrared images misaligned, i.e. uncorrected for parallax error. FIG. 10 shows the same images corrected for parallax error. Referring to FIG. 9, the center quarter of the display shows a blurry (unfocused) and unregistered infrared-only image 40 placed within the surrounding framework of a visible only image 42. The rectangular dark sections 44 in the image are misaligned (unregistered) showing the parallax error resulting from the unfocused infrared image 44. Referring to FIG. 10, the rectangular dark sections 44 in the infrared image 40 are registered with the portions of such sections 44 in the visible only image 42, showing that infrared image is now properly focused. FIGS. 9 and 10 highlight a method by which a user of camera 10 could focus the infrared image 40 by merely rotating focus ring 16 until image 40 is properly registered. Although FIGS. 9 and 10 show the center quarter of the display as infrared only, this same method and technique could be used for a blended visible and infrared image, whether the images are shown picture in picture, full display, alarm mode, or other display modes.

Note that objects within the scene that are not at the focus distance will still exhibit a parallax error. Nearer objects will exhibit a larger parallax error than objects beyond the focus distance. In practice, parallax error becomes negligible beyond a focus distance of approximately 8 feet for lenses used with typical infrared cameras. Also note that parallax errors can only be corrected down to a limited close focus distance to the camera (typically about 2 feet). This distance is determined by how much "extra" field of view the visible-light sensor provides as compared to the infrared sensor.

When an image is captured, the full visible-light image and the full infrared image with all of the ancillary data are saved in an image file on the camera memory card. That part of the visible-light image not displayed which lies outside of the camera display dimensions when the image was taken is saved as part of the visible-light image. Later, if an adjustment in the registration between the infrared and visible-light image is needed, either in the camera or on a computer, the full visible-light image is available.

The camera allows the operator to adjust the registration of the visible-light and infrared image after an infrared/Visible-light image pair is captured and stored in memory. One way to accomplish this is to use the infrared lens position as an input control. This allows the operator to fine-tune the registration, or to manually register objects in the scene that were not at the infrared focus distance when the images were captured, simply by rotating the focus ring on the lens.

The visible-light image, when it is the only displayed image, is displayed preferably in color, although it need not be. When it is blended with the infrared image, the visible-light image is converted to gray scale before it is blended so that it only adds intensity to the colored infrared image.

Figure 11:
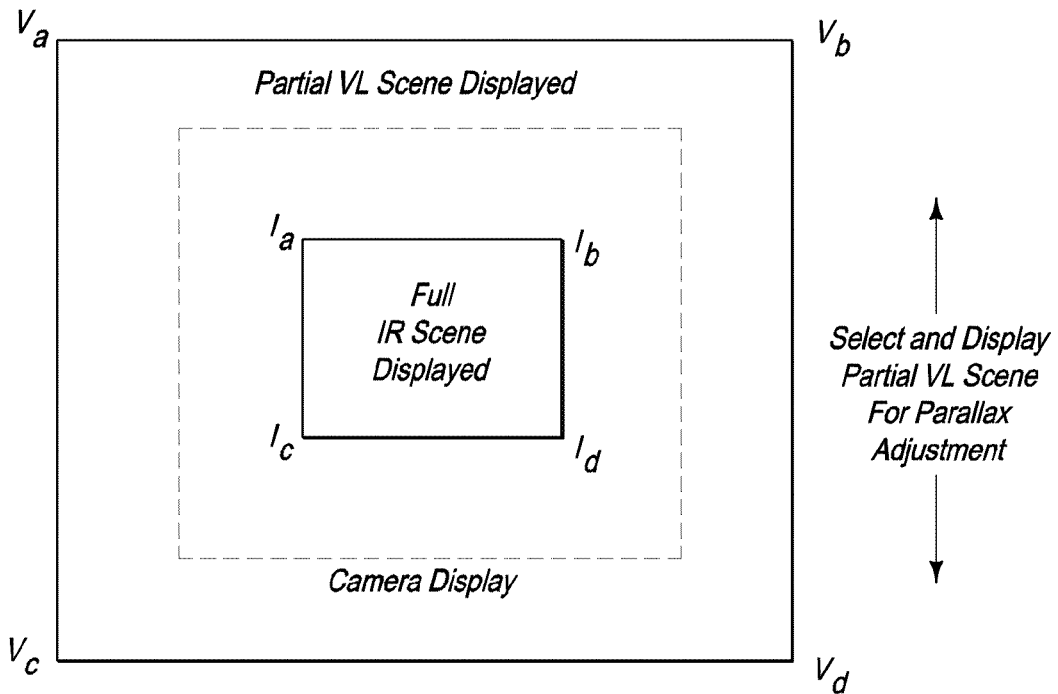
FIG. 11 shows the (Partial-Screen, Partial-Sensor infrared)/(Full-Screen, Full-Sensor Visible-Light) scene display mode. In this mode, the camera uses all of the visible-light sensor elements to fill the display.

FIG. 11 shows the scene display mode entitled "Partial-Screen, Full-Sensor Infrared and Full-Screen, Partial-Sensor Visible-Light display mode." In this mode, the camera uses all of the available infrared sensor elements to provide an infrared image that fills only a central area of the camera display.

Standard image processing techniques (e.g. scaling and windowing, for example) are used to fit the infrared image into the desired area of the display. The IFOV of the visible-light image is adjusted to match the IFOV of the infrared image and then a portion of the visible-light image is selected to fill the full display and to match the infrared image in the center of the display. The center quarter of the display can be infrared only, visible-light only or a blend of the two. The remaining three-quarters of the display (outer framework) is visible-light only.

The camera uses the same technique in this mode as that described for the full screen mode to correct for parallax.

Figure 12:
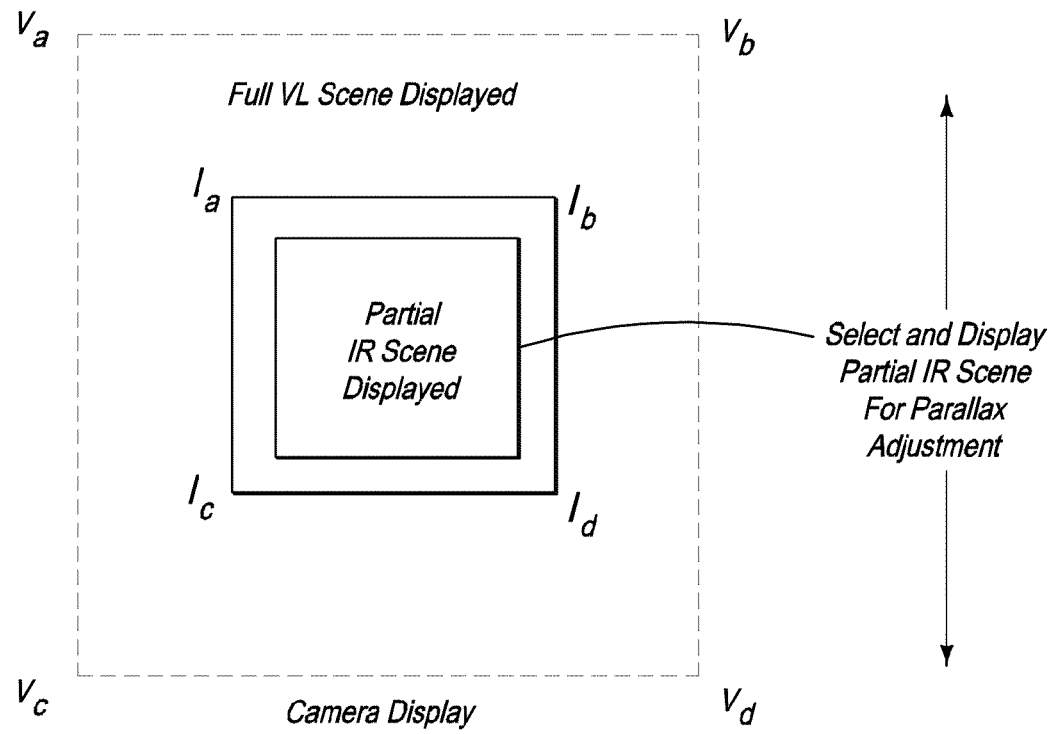
FIG. 12 shows the (Partial-Screen, Full-Sensor infrared)/(Full-Screen, Partial-Sensor Visible-Light) scene display mode. In this mode, the camera uses all of the available infrared sensor elements to provide an infrared image that fills only a central area of the camera display.
Figure 13:
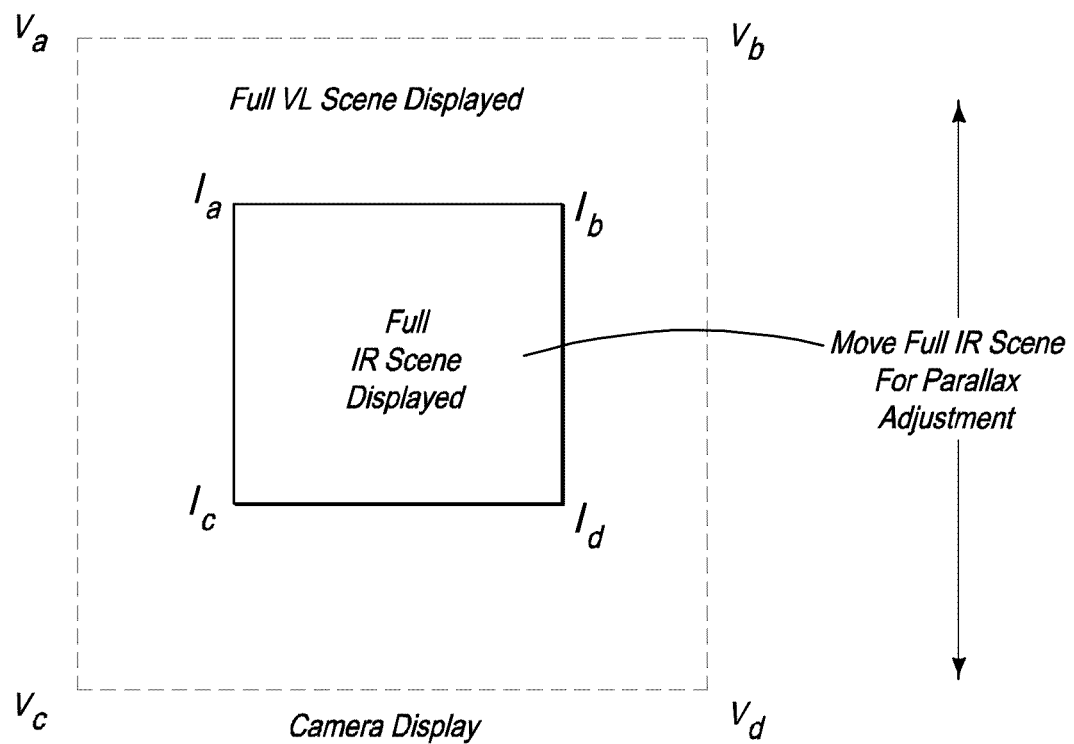
FIG. 13 shows the (Partial-Screen, Full-Sensor infrared)/(Full-Screen, Full-Sensor Visible-Light) scene display mode. In this mode, the camera uses all of the infrared and all of the visible-light sensor elements to construct the displayed images.

Alternatively, instead of matching the visible-light image to the infrared image just the opposite may be done. FIGS. 12 and 13 illustrate this technique. FIG. 12 shows a picture-in-a-picture "Partial-Screen, Partial-Sensor infrared and Full-Screen, Full-Sensor Visible-Light scene display mode." In this mode, the camera uses all of the visible-light sensor elements to fill the display. If the number of visible-light sensor elements does not match the number of display pixels, the camera uses standard imaging techniques to create an image that fills the display screen. A portion of the available infrared sensors is chosen to provide the infrared image. The infrared image is windowed and matched so that the resulting infrared display pixels provide the same IFOV as the visible-light image display pixels.

The camera uses similar techniques to those described for FIG. 6 to correct for parallax. However, in this mode, different areas of the infrared sensor are selected to match the center region of the visible-light image as the infrared focus distance is changed. Note that in this mode, the infrared image is always displayed in a fixed position in the middle of the display.

FIG. 13 shows the "Partial-Screen, Full-Sensor infrared and Full-Screen, Full-Sensor Visible-Light scene display mode." In this mode, the camera uses all of the infrared and all of the visible-light sensor elements to construct the displayed images. The visible-light image is scaled to completely fill the display. The infrared image is windowed and scaled so that the IFOV of the resulting display pixels match the visible-light image. The resulting image is displayed over the matching area of the visible-light image.

Like the previously described mode, parallax is corrected by moving the infrared image scene to align it with the visible-light image scene.

Alpha-Blending

Alpha-blending is a process of rationing the transparency/opaqueness of two images superimposed on one pixel. If the Alpha=maximum, then the first image is opaque and the second is transparent and is so written to the display. If Alpha=0, then the first image is transparent and the second image is opaque and is so written to the display. Values in-between cause 'blending' (alpha blending) between the two sources, with the formula Display=Source 1*(Alpha/max_Alpha)+Source 2*((max_Alpha-Alpha)/max_Alpha).

Figure 14:
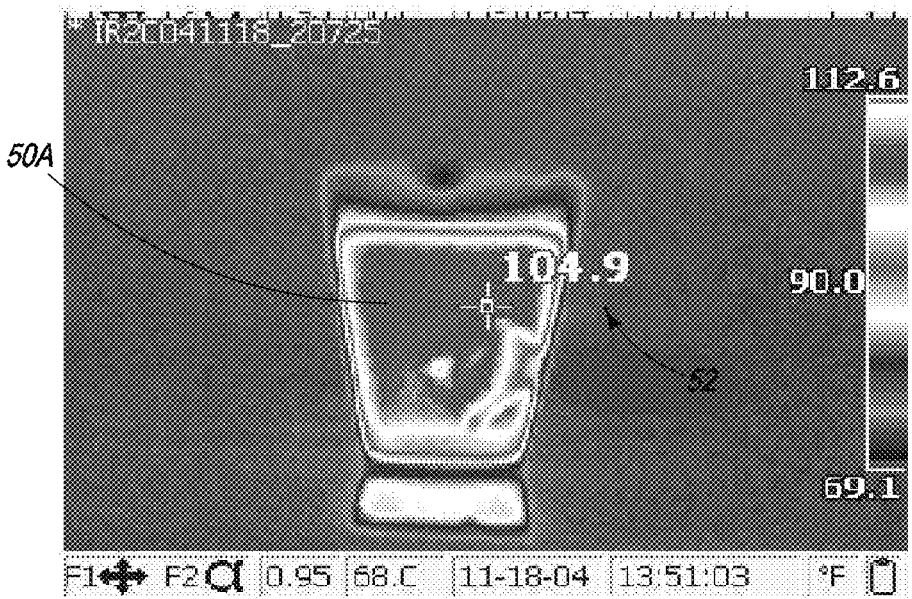
FIGS. 14-16 show respectively, an infrared only image of an insulated cup, a visible-light only image of the cup and a partial alpha-blended image of the cup.
Figure 15:
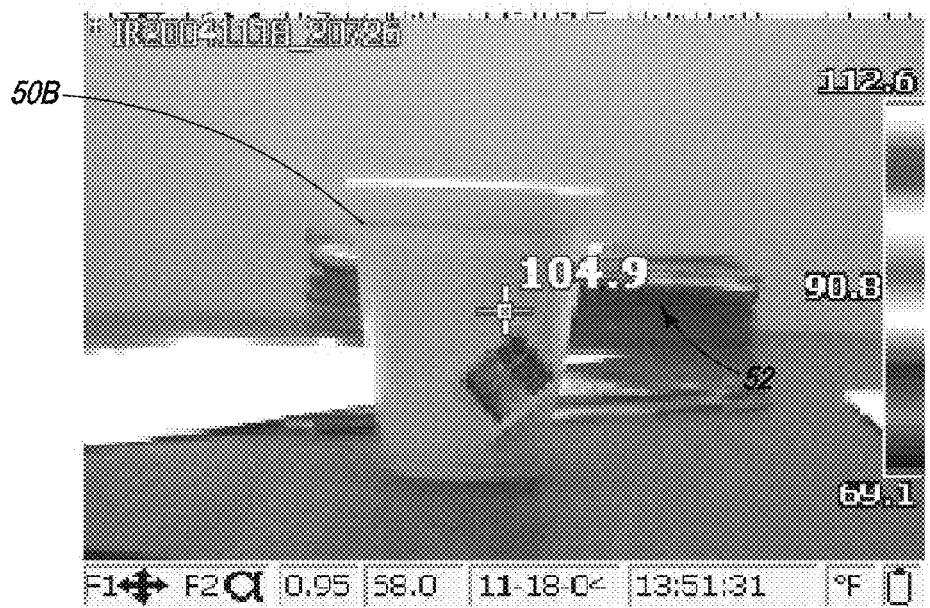
Figure 16:
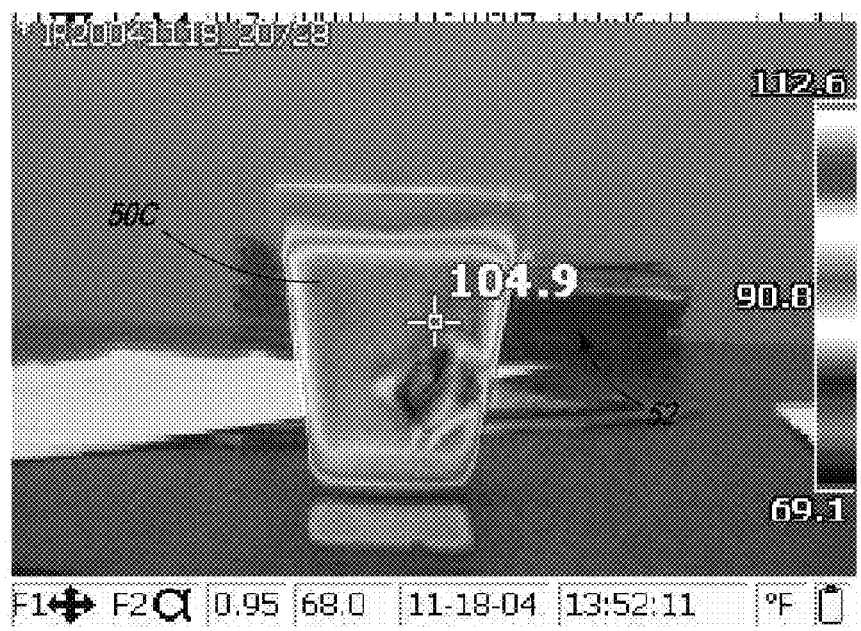

FIGS. 14-16, show respectively, an infrared only image of an insulated cup, a visible light (VL) only image of the cup, and a partial alpha-blending of the infrared and VL images.

The camera will enable the operator to adjust the alpha blending of the visible and infrared images from the extremes of infrared-only (FIG. 14) or visible-only (FIG. 15) to any combination of alpha blending between these two extremes (FIG. 16). Note that although the infrared image is not visible in FIG. 15, the underlying infrared image data is used to display the correct object temperature 52 in the visible light image. Thus, as the cursor is moved over the visible-light image, the temperature 52 associated with the cursor's location on the image is displayed.

The infrared and visible-light images can be displayed in either color or grayscale. When color is used to portray temperatures in the infrared image, the visible image in the overlap area can be displayed in grayscale only so that it doesn't excessively corrupt the infrared palette colors.

When an image is saved, both the visible and infrared images are saved individually so reconstructing images with different alpha blending can be accomplished later either in the camera, or with PC software.

Alarm Modes

Figure 17:
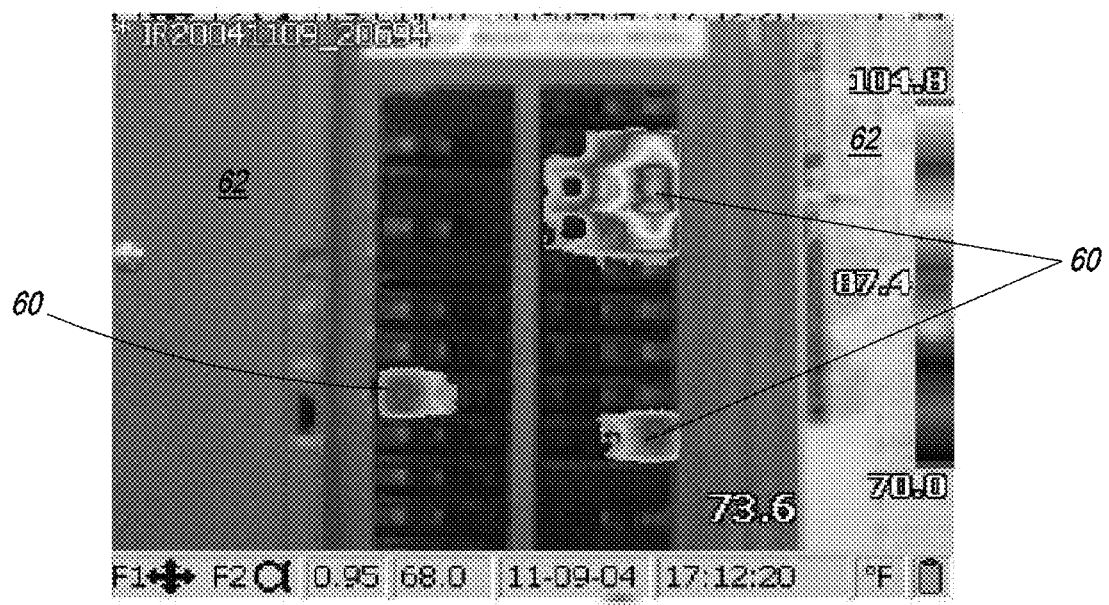
FIG. 17 shows an example of a "hot threshold" alarm mode display.

The camera supports several different visual alarm modes. These modes are used to call the operator's attention to areas of interest in the visible-light image by displaying an alpha-blended or infrared only image in areas that meet the alarm criteria as set by the user. FIG. 17 shows an example of the "hot threshold" alarm mode. Only those pixels in the infrared image that exceed a set temperature threshold (hotspots 60) are displayed. In the color alarm mode, the visible-light image 62 is switched to gray scale so that the infrared image stands out with no ambiguity. The camera can provide alarm modes, such as those described below. Other alarm modes are also possible.

Absolute hot threshold—infrared pixels above a defined temperature are alpha-blended with corresponding visible-image pixels.

Absolute cold threshold—infrared pixels below a defined temperature are alpha-blended with corresponding visible-image pixels.

Relative hot threshold—A temperature range is defined by the user. The temperature range is relative to the current hottest pixel (or average of a set number of hottest pixels) in the scene or from a previous scene or reference scene. Infrared pixels above the threshold defined by the current hottest pixel(s) in the scene minus a user defined or predetermined temperature range are alpha-blended with their corresponding visible-image pixels. For example, if the temperature range is 5 degrees, and the current hottest pixel(s) in the scene is 100 degrees, for example, all infrared pixels above 95 degrees in the scene will be alpha-blended with corresponding visible-light pixels.

Relative cold threshold—A temperature range is defined by the user. The temperature range is relative to the current coldest pixel (or average of a set number of coldest pixels) in the scene or from a previous scene or reference scene. Infrared pixels below the threshold defined by the current coldest pixel(s) in the scene plus a user defined or predetermined temperature range are alpha-blended with their corresponding visible-image pixels. For example, if the temperature range is 5 degrees, and the current coldest pixel(s) in the scene is 10 degrees, all infrared pixels below 15 degrees in the scene will be alpha-blended with corresponding visible-light pixels.

Absolute range (isotherm)—The operator enters a temperature range. Infrared pixels with a temperature within the set range are alpha-blended with their corresponding visible-light pixels. For example, the user enters a range of 80-100 degrees. All infrared pixels with a temperature value within the 80-100 degree range are alpha-blended.

Alarm flash mode—To further call attention to areas of interest, the camera may provide a mode whereby the alpha-blended areas are "flashed" by alternately displaying the alarmed pixels as visible-light only, and then either alpha-blended or infrared only.

The alarm modes identified above may also be indicated audibly or via vibration. Such audible or vibrational alarms may be useful in situations where hotspots are small enough to otherwise go unnoticed in the visual display. In embodiments that include audible or vibration alarms, the camera can generate such an alarm to alert the camera operator when, for instance, the camera detects an out of specification temperature or any of the other alarms modes identified above. Referring back to FIG. 3, the camera may include an alarm module connected to the FPGA that provides audible or vibrational alarms. The vibration mechanism can be similar to that used in cellular phones to alert persons of an incoming call.

PC Software

All of the image display techniques described for the camera can also be implemented in software that runs on a PC host computer and can be applied to images captured by the camera.

Advantages

Figure 18:
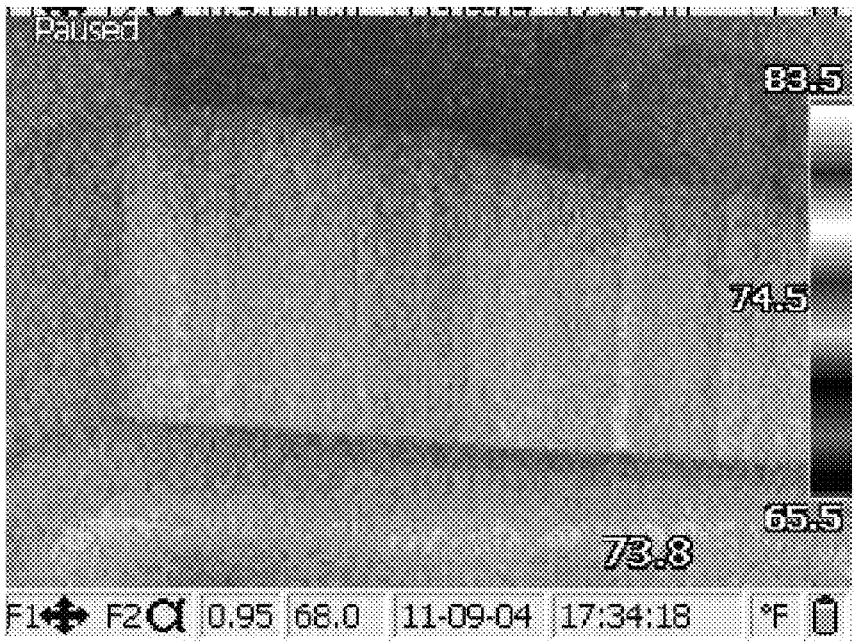
FIG. 18 shows a typical infrared image of a low infrared contrast scene.
Figure 19:
FIG. 19 shows the same scene with an alpha-blended visible-light image, yielding a much higher apparent contrast.

The advantages have already been stated above. The infrared image will not only be sharper with much more detail, it will be surrounded with a visual image showing exactly what and where the infrared targets are. Parallax error will be automatically corrected, yielding a visible-light control image that is correctly registered with the infrared image. Infrared cameras can be made with smaller less expensive detector arrays, yet display the apparent detail and contrast of very expensive infrared cameras with large and ultra-sensitive detector arrays. FIG. 18 shows a typical infrared image of a low infrared contrast scene. FIG. 19 shows the same scene with an alpha-blended visible-light image, yielding a much higher apparent contrast with target site temperature measurement.

Uses

This camera can be used in all phases of infrared thermography where current infrared cameras are used today and in the future. In the case of the simplest uses such as an electricians tool, the camera can be made inexpensively with a small infrared detector array and yet have very high performance—high image quality with high spatial resolution and accurate temperature. In the case of high-end thermography the camera can be made at a lower cost and have images with greater apparent detail than the most expensive infrared cameras. The camera will eliminate the need to take separate visible-light images to be included in thermography reports.

Laser Pointer

Various applications are possible using the laser embodiments of the present invention. As previously mentioned, because the laser pointer radiation is in the visible spectrum, it is not visible in the infrared image. As a result, the laser pointer is of limited value in infrared cameras. This is problematic when the location of a hot or cold spot is difficult to identify. For example, large industrial control panels often have many components that are similar in shape and packed tightly together. It is sometimes difficult to determine the exact component that is causing a hot spot in the infrared camera image. In addition, in building inspection applications where a wall appears uniform in the visible image but shows a defect in the infrared image, the laser pointer of the embodiments of the invention can be used to identify the exact location of the defect on the wall. For roof leak detection applications, it can greatly aid the thermographer in marking the area suspected of needing repair. The camera operator can outline the wet area by adjusting the camera pointing so that the laser spot seen in the image outlines the suspected wet area in the image and thus also outlines the suspected wet area on the roof with the laser beam so that it can be correctly marked. In an R&D application where the target is complex such as a printed wiring board assembly, the laser pointer embodiments of the invention may aid in identifying the location of the infrared point of interest.

Figure 24:
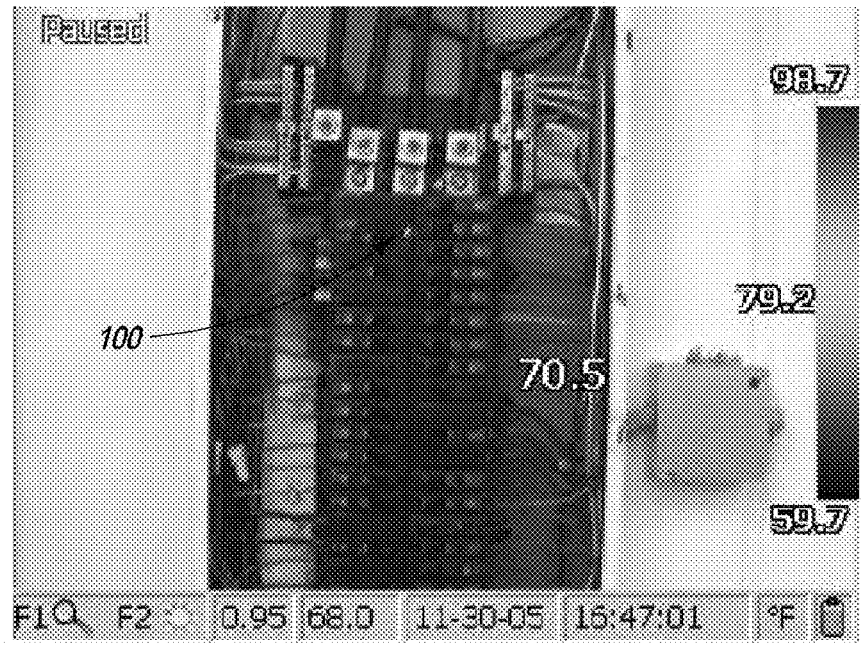
FIGS. 24-26 show, respectively, a visible-light only image with a laser point, an alpha-blended visible-light/infrared image with a laser point and hot spot not aligned, and an alpha-blended visible-light/infrared image with a laser point spot aligned.
Figure 25:
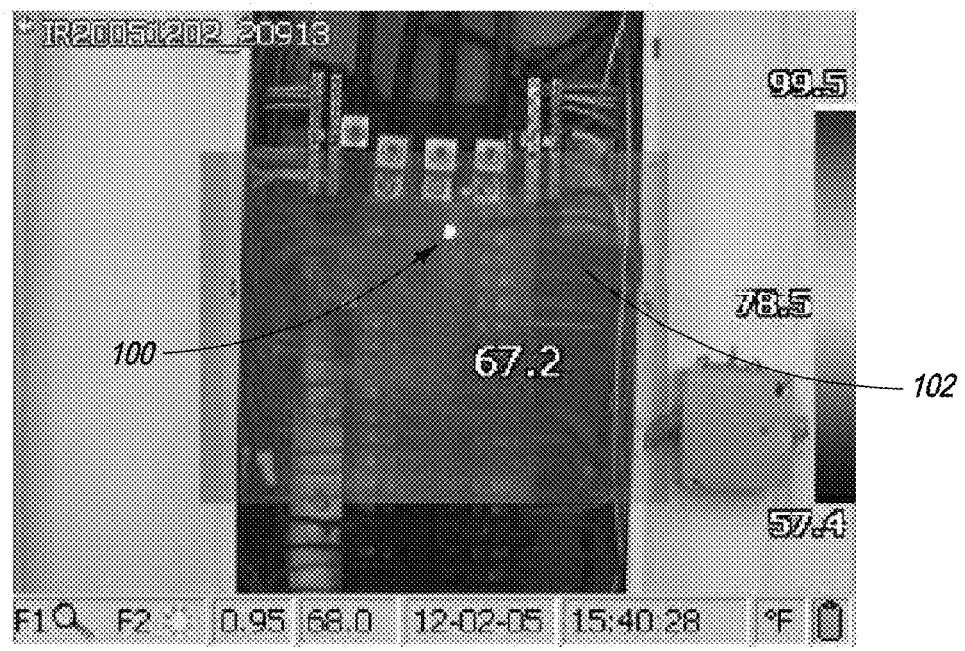
Figure 26:
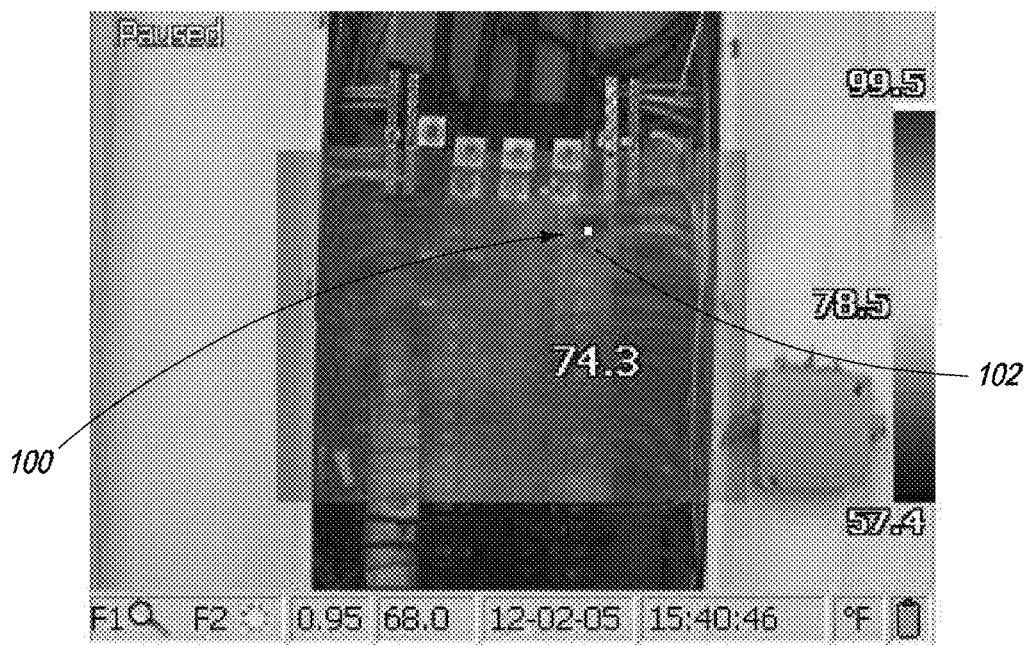

The laser pointer of the embodiments of the invention is used to accurately identify the location of infrared points-of-interest and to easily aid the focusing of the infrared optics. FIGS. 24-26 show an associated sequence of events. The laser pointer can be turned on using one of the camera's programmable buttons or by other mechanisms by the camera operator. At a reasonable distance, the laser pointer spot 100 on the target can be seen in the visible-light image (FIG. 24) and in the blended visible-light and infrared image that has been corrected for parallax error (FIG. 25). Once the laser spot is identified in the blended image (FIG. 25), the camera operator can adjust the camera pointing until the laser spot in the blended image matches the spot of interest 102 in the infrared image (FIG. 26). The laser beam then marks the target at the point-of-interest (FIG. 26).

Figure 27:
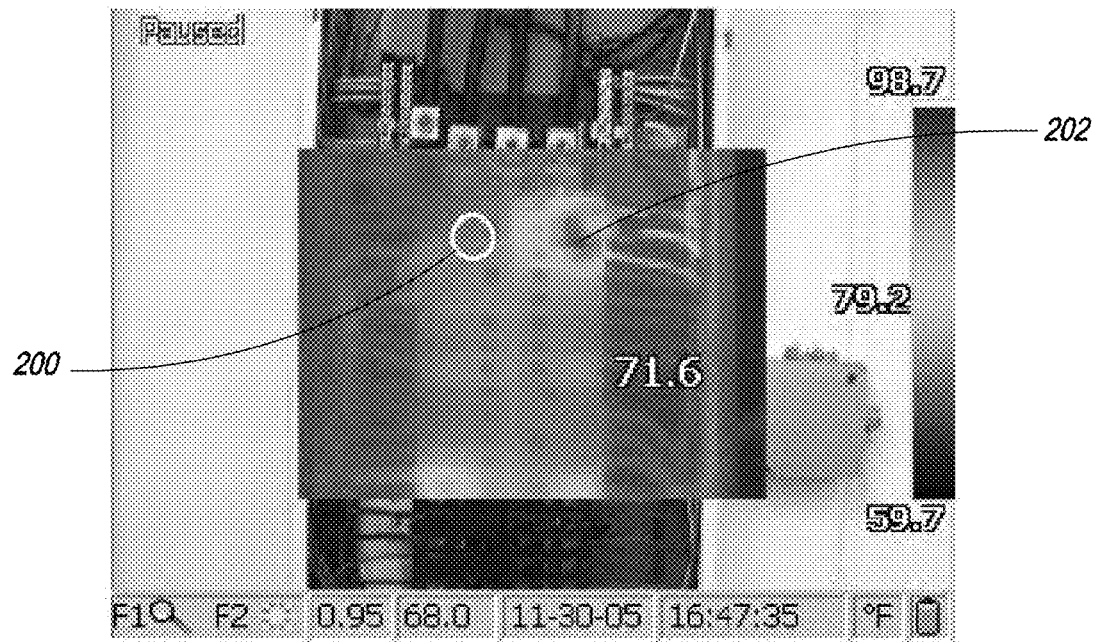
FIGS. 27-28 show, respectively, an infrared only image with a computer generated laser pointer and hot spot not aligned and an infrared only image with the computer generated laser pointer and hot spot aligned.
Figure 28:
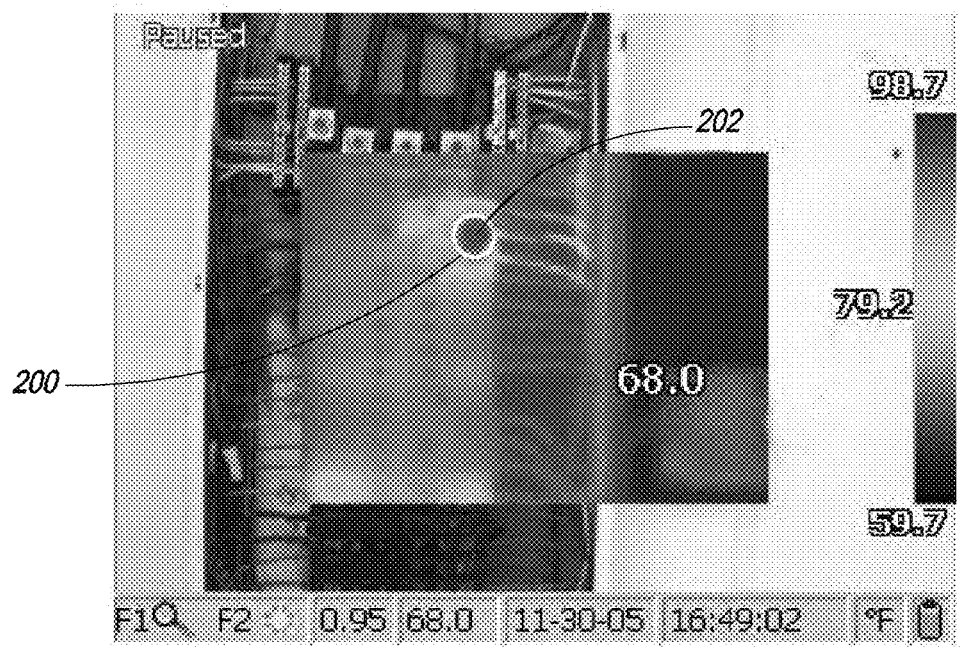

Because the camera according to the embodiments of the invention has been calibrated in the factory to identify the location of the laser spot in the infrared image using parallax calibration data as a function of infrared camera module focus distance, the camera operator does not need to see displayed the laser spot in the VL image. If the target is at a distance and/or has a low reflection for the laser wavelength, the laser spot may be too weak for the VL camera to show prominently on the camera display but it can still be seen on the target by the human observer. FIGS. 27 and 28 show an associated sequence of events. In this case, the infrared focus is adjusted as normally done by observing the sharpness of the infrared image. A computer-generated laser spot reference mark 200 is registered with the infrared image so that a representative mark (e.g., circle) is displayed on the infrared image (FIG. 27). The camera operator then adjusts the camera pointing until the laser calibration mark 200 lies over the infrared point-of-interest 202 (FIG. 28). Once that happens, the laser beam then strikes the target at the point of interest.

Figure 20:
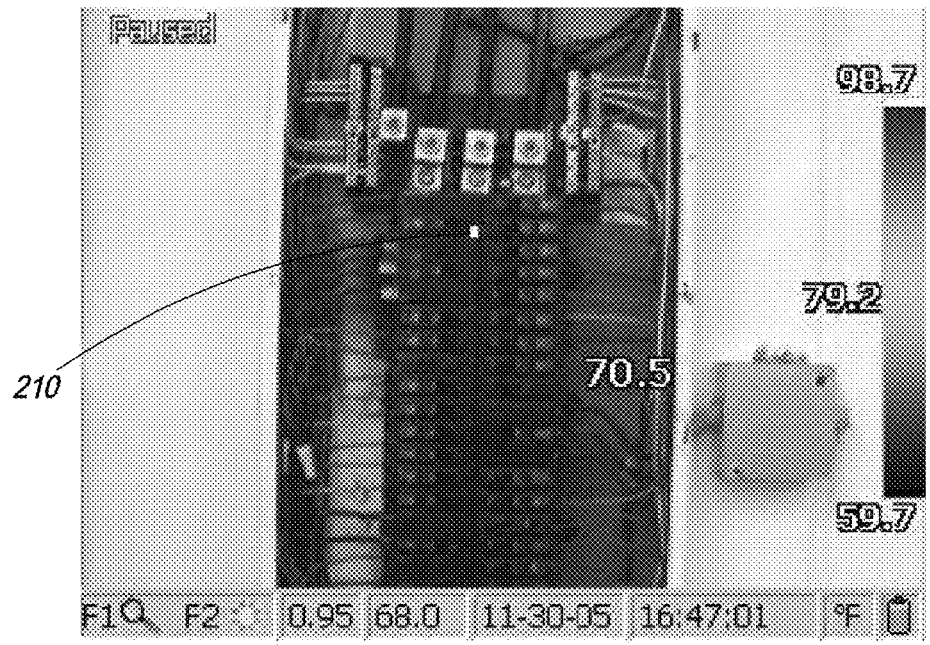
FIGS. 20-23 show, respectively, a visible-light image with a laser spot, a visible-light image with the laser spot and a computer generated laser marker aligned with the laser spot, an infrared only image with the computer generated laser marker and hot spot not aligned, and an infrared only image with the computer generated laser marker and hot spot aligned.
Figure 21:
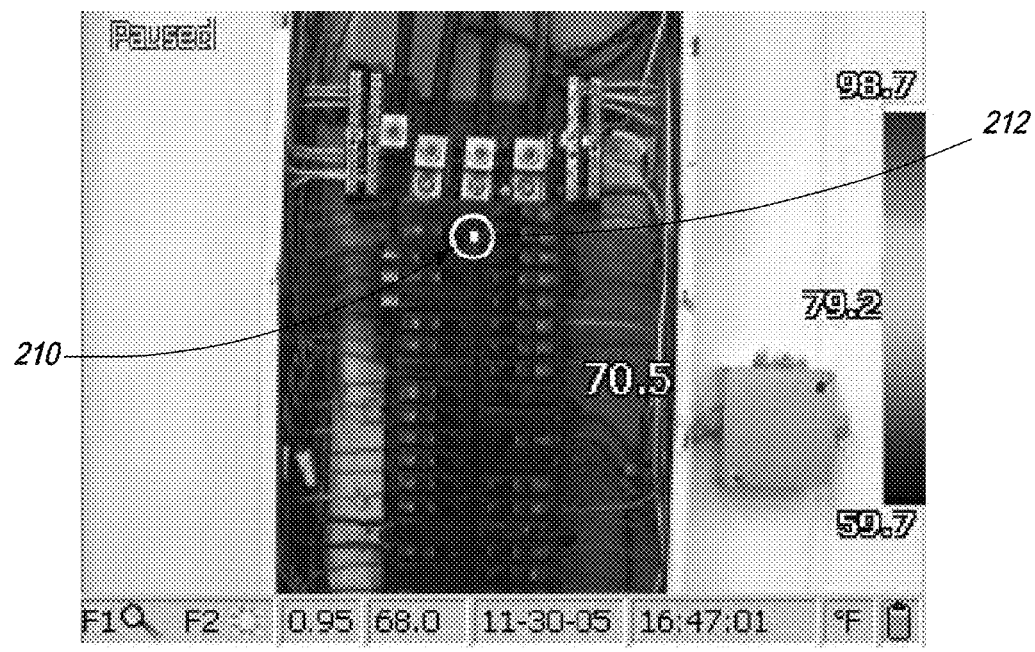
Figure 22:
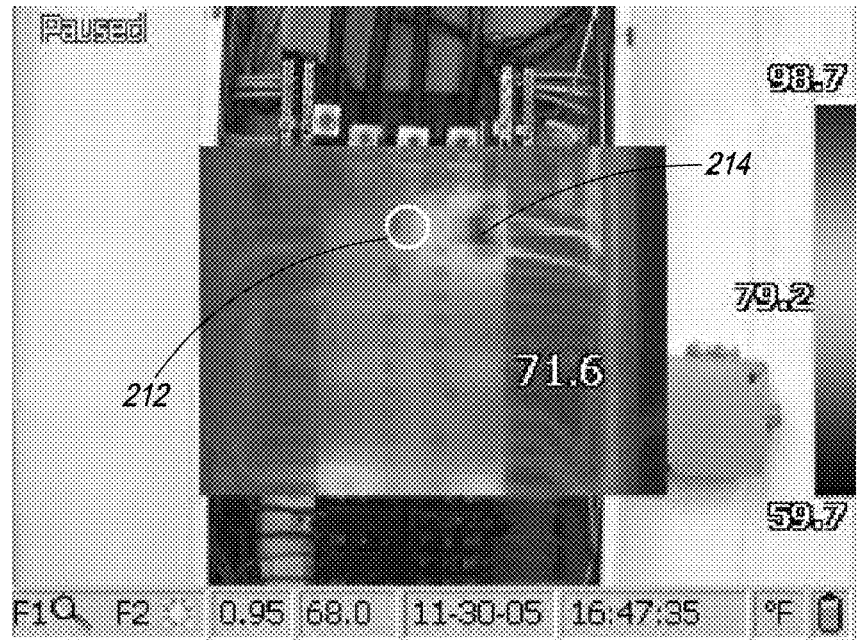
Figure 23:
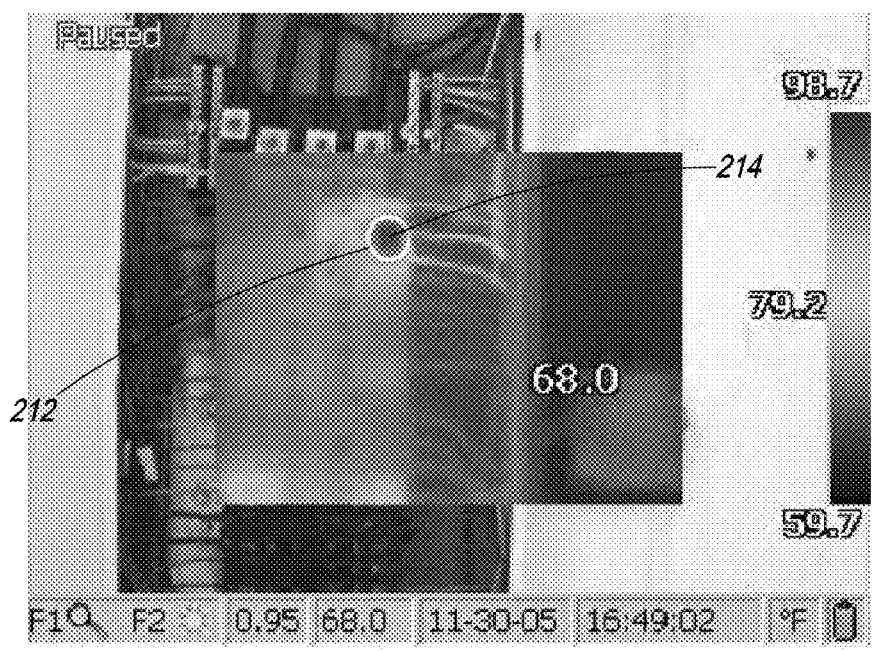

Alternatively, the camera operator first focuses the infrared image using an infrared display image only, switches to the visible-light display where the laser 210 will be shown in the display as seen in FIG. 20. The operator marks the laser spot 210 on the display with a marking 212 such as a circle (see FIG. 21) and then switches the display back to the infrared only (see FIG. 22) where the marking 212 is registered with the infrared image and it is displayed on the infrared image, positioned in the center quarter of the display area. The operator then adjusts the camera pointing so that the mark 212 on the infrared display matches the thermal spot of interest 214 on the infrared display. (see FIG. 23) Once that happens, the laser beam then strikes the target at the point of interest.

Using the Laser Pointer to Focus the Infrared Image

Figure 29:
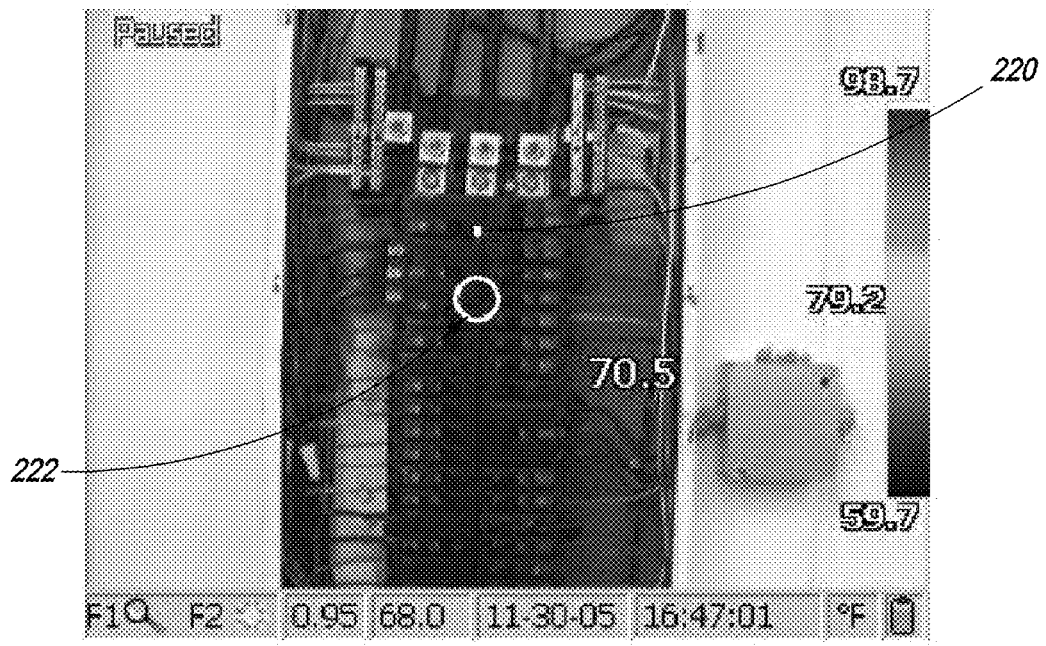
FIGS. 29-30 show, respectively, a visible-light only image with a laser spot and a computer generated laser marker not aligned and a visible-light only image with the laser spot and computer generated laser marker aligned.
Figure 30:
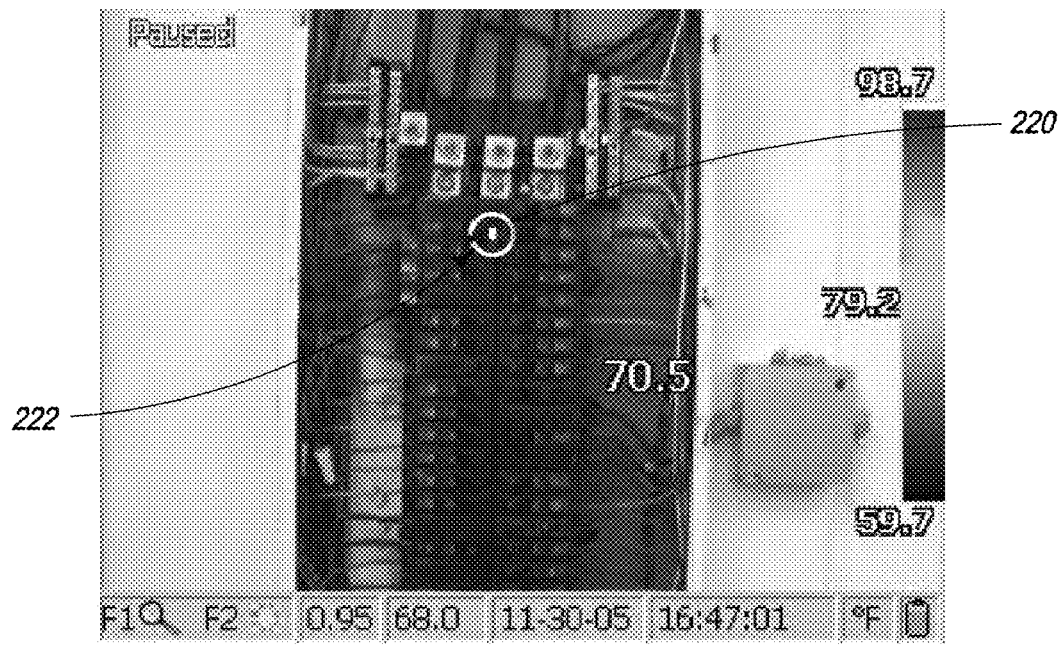

With calibration data correcting for parallax between the laser pointer and the infrared image and the ability to see the actual laser spot in the VL image, a process for monitoring and aiding the infrared focus is possible. FIGS. 29 and 30 show an associated sequence of events. In this case, the location of the laser spot 220 is visible in the VL image (FIG. 29). The camera according to the embodiments of the invention has been calibrated in the factory to generate a computer-generated laser spot reference mark 222 that indicates the location of the laser spot in a focused infrared image using parallax calibration data as a function of infrared camera module focus distance. This reference mark may be displayed in the IR image or the VL image (that overlaps the IR image). In FIG. 29, the reference mark 222 is shown in the VL only image. As the infrared lens is adjusted, the mark moves in the VL image showing the spot where the laser dot would be in the infrared image. When the infrared mark is coincident with the laser dot seen in the VL image (FIG. 30), the focus adjustment may stop and the infrared camera module is in focus. This allows the most novice operator to focus the infrared lens and eliminates the subjective nature of focusing.

What is claimed is:

1. A method of displaying visible-light (VL) images and infrared (IR) images, the method comprising:
    providing a camera having a VL lens with a VL sensor, an IR lens with an IR sensor, and a display, the VL lens and the IR lens being located on the camera such that an optical axis of the VL lens is offset from, and generally parallel to, an optical axis of the IR lens so the VL sensor and the IR sensor sense a VL image and an IR image, respectively, of a target scene from different points of view causing a parallax error, the IR lens being manually rotatable;
    displaying at least a portion of the VL image and at least a portion of the IR image on the display, the relative positions on the display of the at least the portion of the VL image and of the at least the portion of the IR image being controllable via rotation of the IR lens; and
    manually rotating the IR lens until the at least the portion of the VL image and the at least the portion of the IR image are positioned in register on the display to correct the parallax error, the registration via IR lens rotation focusing the IR lens on the target scene.

2. The method of claim 1, wherein the portion of the IR image is displayed without displaying a corresponding portion of the VL image.

3. The method of claim 1, wherein the portion of the VL image is displayed without displaying a corresponding portion of the IR image.

4. The method of claim 1, wherein the portion of the IR image is blended with a corresponding portion of the VL image.

5. The method of claim 1, wherein the portion of the IR image is surrounded by the portion of the VL image to effect a picture-in-picture view of the target scene.

6. The method of claim 5, wherein the portion of the IR image is blended with a corresponding portion of the VL image.

7. The method of claim 1, wherein the VL sensor includes an array of VL sensor elements and the IR sensor includes an array of IR sensor elements, the IR image being formed by substantially fewer sensor elements than being used to form the VL image.

8. The method of claim 1, wherein the VL sensor includes an array of VL sensor elements, and wherein the at least the portion of the VL image is formed from fewer than all of the VL sensor elements.

9. The method of claim 1, wherein the IR sensor includes an array of IR sensor elements, and wherein the at least the portion of the IR image is formed from all of the IR sensor elements.

10. The method of claim 9, wherein the at least the portion of the IR image fills only part of the display, the part of the display being generally centrally located on the display.

11. The method of claim 10, wherein the at least the portion of the VL image fills the remainder of the display not filled by the at least the portion of the IR image, whereby the target scene is displayed in a picture-in-picture view.

12. The method of claim 11, wherein the at least the portion of the VL image fills the entire display, the portion of the IR image being blended with a corresponding portion of the VL image, whereby the target scene is displayed in a picture-in-picture view.

13. The method of claim 1, wherein the at least the portion of the IR image fills the entire display.

14. The method of claim 1, wherein focusing the IR lens on the target scene comprises moving the IR lens with respect to the IR sensor.

15. The method of claim 1, further including sensing the IR lens focus position, the IR lens focus position being used to bring the VL image into register with the IR image.

16. The method of claim 15, further including determining the distance to the target scene based on the IR lens focus position.

17. The method of claim 1, further including reading a lens position sensor to sense the IR lens focus position.

18. A method of displaying visible-light (VL) images and infrared (IR) images, the method comprising:
    providing a camera having a VL lens with a VL sensor, an IR lens with an IR sensor, and a display, the VL lens and the IR lens being located on the camera such that an optical axis of the VL lens is offset from, and generally parallel to, an optical axis of the IR lens so the VL sensor and the IR sensor sense a VL image and an IR image, respectively, of a target scene from different points of view causing a parallax error;
    displaying at least a portion of the VL image with at least a portion of the IR image on the display, the at least the portion of the IR image being displayed without the corresponding portion of the VL image; and
    registering the VL image with the IR image on the display by displacing the VL image and the IR image relative to each other until registered to correct the parallax error via a manual adjustment mechanism, the registration via the manual adjustment mechanism focusing the IR lens on the target scene.

19. The method of claim 18, wherein the IR image has a smaller field of view than the VL image and the at least the portion of the IR image is surrounded by the at least the portion of the VL image to effect a picture-in-picture view of the target scene.

20. The method of claim 18, wherein the VL sensor includes an array of VL sensor elements and the IR sensor includes an array of IR sensor elements, the IR image being formed by substantially fewer sensor elements than being used to form the VL image.

21. The method of claim 18, wherein the VL sensor includes an array of VL sensor elements, and wherein the at least the portion of the VL image is formed from fewer than all of the VL sensor elements, the IR sensor including an array of IR sensor elements, and the at least the portion of the IR image is formed from all of the IR sensor elements.

22. The method of claim 18, wherein the at least the portion of the IR image fills only part of the display, the part of the display being generally centrally located on the display, the at least the portion of the VL image fills the remainder of the display not filled by the at least the portion of the IR image, whereby the target scene is displayed in a picture-in-picture view.

23. A camera producing visible light (VL) and infrared (IR) images, the camera comprising:
    a VL lens;
    a VL sensor associated with the VL lens and having an array of VL sensor elements that produce a VL image of a target scene;

an IR lens;

an IR sensor associated with the IR lens and having an array of IR sensor elements that produce an IR image of the target scene, the IR image being formed by substantially fewer sensor elements than being used to form the VL image, the VL lens with the VL sensor having a larger field of view than the IR lens with the IR sensor, the IR lens being manually rotatable, rotation of the IR lens causing an axial shift of the IR lens relative to the IR sensor to focus the IR lens;

the VL lens and the IR lens being located on the camera such that an optical axis of the VL lens is offset from, and generally parallel to, an optical axis of the IR lens so the VL sensor array of pixels and the IR sensor array of pixels sense the target scene from different points of view causing a parallax error, the focusing of the IR lens registering the VL image with the IR image to correct the parallax error; and a display for concurrently displaying at least a portion of the VL image registered with at least a portion of the IR image, the displayed portion of the IR image being surrounded by the VL image to effect a picture-in-picture view of the target scene.

24. The camera of claim 23, wherein the portion of the IR image is displayed without displaying a corresponding portion of the VL image.

25. The camera of claim 23, wherein the portion of the VL image is displayed without displaying a corresponding portion of the IR image.

26. The camera of claim 23, wherein the portion of the IR image is blended with a corresponding portion of the VL image.

27. The camera of claim 23, wherein the at least the portion of the IR image fills only part of the display, the part of the display being generally centrally located on the display, the at least the portion of the VL image fills the remainder of the display not filled by the at least the portion of the IR image.

28. The camera of claim 23, wherein the at least the portion of the VL image is formed from fewer than all of the VL sensor elements, and the at least the portion of the IR image is formed from all of the IR sensor elements.

29. The camera of claim 23, further including a sensor that determines a value indicative of the axial distance between the IR lens and the IR sensor, the value being used to register the VL image with the IR image to correct the parallax error.

30. The camera of claim 29, wherein the value indicative of the axial distance provides a value indicative of the distance to the target scene.

31. A computer-readable medium programmed with instructions for performing a method of registering multiple images, the medium comprising instructions for causing a programmable processor to:

receive a first image of a target scene, the first image being produced by a VL lens and a VL sensor with an array of VL sensor elements;

receive a second image of the target scene, the second image having a parallax error with the first image and being produced by an IR lens and an IR sensor with an array of IR sensor elements, the IR sensor having substantially fewer sensor elements than the VL sensor;

display at least portions of the first and second images on a display; and move the first and second images relative to each other on the display in response to a user input, the user input changing the focus of the IR lens as the first and second images are moved, when the first and second images are moved into register to correct the parallax error the IR lens being focused on the target scene.

32. The computer-readable medium of claim 31, further comprising determine a value indicative of the distance between the IR lens and a target within the target scene.

33. The computer-readable medium of claim 32, wherein the value indicative of the distance between the IR lens and the target is the IR lens focus position or the distance between the IR lens and the target.

34. The computer-readable medium of claim 33, further comprising display the distance between the IR lens and the target.

35. The computer-readable medium of claim 32, further comprising receive a sensed focus position of the IR lens.

36. The computer-readable medium of claim 35, wherein the value indicative of the distance between the IR lens and the target is based on the sensed IR lens focus position.

37. The computer-readable medium of claim 35, wherein the sensed IR lens focus position is received from a lens position sensor.

38. The computer-readable medium of claim 31, wherein the portion of the second image is displayed without displaying a corresponding portion of the first image.

39. The computer-readable medium of claim 31, wherein the portion of the first image is displayed without displaying a corresponding portion of the second image.

40. The computer-readable medium of claim 31, wherein the portion of the second image is blended with a corresponding portion of the first image.

41. The computer-readable medium of claim 31, wherein the at least the portion of the VL image is formed from fewer than all of the VL sensor elements, and the at least the portion of the IR image is formed from all of the IR sensor elements.

42. The computer-readable medium of claim 31, wherein the VL lens with the VL sensor has a larger field of view than the IR lens with the IR sensor, and the displayed portion of the second image is surrounded by the first image to effect a picture-in-picture view of the target scene.

43. The computer-readable medium of claim 31, wherein the at least the portion of the second image fills only part of the display, the part of the display being generally centrally located on the display, the at least the portion of the first image fills the remainder of the display not filled by the at least the portion of the second image, whereby the target scene is displayed in a picture-in-picture view.

* * * * *